United States Patent
Meinhold et al.

(10) Patent No.: US 9,773,719 B2
(45) Date of Patent: Sep. 26, 2017

(54) SEMICONDUCTOR PACKAGES AND METHODS OF FABRICATION THEREOF

(71) Applicant: Infineon Technologies Dresden GmbH, Dresden (DE)

(72) Inventors: Dirk Meinhold, Dresden (DE); Frank Daeche, Unterhaching (DE); Thorsten Scharf, Regensburg (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 678 days.

(21) Appl. No.: 13/685,529

(22) Filed: Nov. 26, 2012

(65) Prior Publication Data

US 2014/0145319 A1 May 29, 2014

(51) Int. Cl.
*H01L 21/00* (2006.01)
*H01L 23/492* (2006.01)
(Continued)

(52) U.S. Cl.
CPC ........ *H01L 23/492* (2013.01); *H01L 23/3185* (2013.01); *H01L 23/49562* (2013.01); *H01L 24/05* (2013.01); *H01L 24/19* (2013.01); *H01L 21/561* (2013.01); *H01L 23/315* (2013.01); *H01L 23/3121* (2013.01); *H01L 23/3135* (2013.01); *H01L 23/522* (2013.01); *H01L 24/06* (2013.01); *H01L 2224/0346* (2013.01); *H01L 2224/04105* (2013.01); *H01L 2224/05005* (2013.01); *H01L 2224/05011* (2013.01); *H01L 2224/05013* (2013.01); *H01L 2224/05017* (2013.01); *H01L 2224/05022* (2013.01); *H01L 2224/05026* (2013.01); *H01L 2224/05096* (2013.01); *H01L 2224/05541* (2013.01); *H01L 2224/05559* (2013.01); *H01L 2224/05571* (2013.01); *H01L 2224/0615* (2013.01);
(Continued)

(58) Field of Classification Search
USPC .................................................. 438/118, 123
See application file for complete search history.

(56) References Cited

U.S. PATENT DOCUMENTS 6,803,667 B2 10/2004 Okura et al.
7,799,614 B2 9/2010 Otremba et al.
(Continued)

FOREIGN PATENT DOCUMENTS

CN 1953166 A 4/2007
DE 10236455 A1 6/2003
(Continued)

OTHER PUBLICATIONS

Ploss, Dr. Reinhard, "IFX Day 2011," Campeon, Jun. 7, 2011, 28 pgs.

*Primary Examiner* — Olik Chaudhuri
*Assistant Examiner* — Wilner Jean Baptiste
(74) *Attorney, Agent, or Firm* — Slater Matsil, LLP

(57) ABSTRACT

In accordance with an embodiment of the present invention, a semiconductor device includes a semiconductor chip having a first side and an opposite second side, and a chip contact pad disposed on the first side of the semiconductor chip. A dielectric liner is disposed over the semiconductor chip. The dielectric liner includes a plurality of openings over the chip contact pad. A interconnect contacts the semiconductor chip through the plurality of openings at the chip contact pad.

24 Claims, 33 Drawing Sheets

(51) Int. Cl.
*H01L 23/00* (2006.01)
*H01L 23/495* (2006.01)
*H01L 23/522* (2006.01)
*H01L 23/31* (2006.01)
*H01L 21/56* (2006.01)

(52) U.S. Cl.
CPC *H01L 2224/291* (2013.01); *H01L 2224/2919* (2013.01); *H01L 2224/2929* (2013.01); *H01L 2224/29294* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29366* (2013.01); *H01L 2224/29369* (2013.01); *H01L 2224/29371* (2013.01); *H01L 2224/32225* (2013.01); *H01L 2224/32245* (2013.01); *H01L 2224/73104* (2013.01); *H01L 2224/73265* (2013.01); *H01L 2224/8382* (2013.01); *H01L 2224/8384* (2013.01); *H01L 2224/83815* (2013.01); *H01L 2224/83862* (2013.01); *H01L 2924/00014* (2013.01); *H01L 2924/12032* (2013.01); *H01L 2924/12042* (2013.01); *H01L 2924/1301* (2013.01); *H01L 2924/1305* (2013.01); *H01L 2924/1306* (2013.01); *H01L 2924/13055* (2013.01); *H01L 2924/13062* (2013.01); *H01L 2924/1461* (2013.01); *H01L 2924/181* (2013.01)

(56) References Cited

U.S. PATENT DOCUMENTS

| | | | |
|---|---|---|---|
| 8,742,598 B2 | 6/2014 | Meinhold | |
| 2001/0013657 A1 | 8/2001 | Anand | |
| 2003/0134455 A1* | 7/2003 | Cheng | H01L 23/13 438/125 |
| 2005/0077626 A1* | 4/2005 | Seiller | H01L 24/05 257/748 |
| 2005/0161833 A1* | 7/2005 | Takeuchi et al. | 257/775 |
| 2007/0020906 A1* | 1/2007 | Chiu | H01L 24/03 438/597 |
| 2007/0052086 A1* | 3/2007 | Oi et al. | 257/698 |
| 2007/0069394 A1* | 3/2007 | Bachman | H01L 24/03 257/780 |
| 2008/0061436 A1 | 3/2008 | Yang et al. | |
| 2010/0059782 A1* | 3/2010 | Fujitomo | H01L 33/486 257/98 |
| 2012/0001306 A1* | 1/2012 | Wang et al. | 257/666 |
| 2013/0087930 A1 | 4/2013 | Meinhold | |
| 2013/0307145 A1 | 11/2013 | Chung et al. | |
| 2013/0341780 A1 | 12/2013 | Scharf et al. | |

FOREIGN PATENT DOCUMENTS

| | | |
|---|---|---|
| DE | 102008062498 A1 | 7/2009 |
| DE | 102008045615 A1 | 3/2010 |
| DE | 1020131036299 A1 | 12/2013 |
| EP | 1988569 A2 | 11/2008 |
| JP | 2007273547 A | 10/2007 |

* cited by examiner

US 9,773,719 B2

SEMICONDUCTOR PACKAGES AND METHODS OF FABRICATION THEREOF

TECHNICAL FIELD

The present invention relates generally to semiconductor devices, and more particularly to semiconductor packages and methods of fabrication thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged. Typical packaging features, such as dimensions of the package, pin count, etc., may comply, among others, with open standards from Joint Electron Devices Engineering Council (JEDEC). Packaging may also be referred as semiconductor device assembly or simply assembly.

SUMMARY OF THE INVENTION

In accordance with an embodiment of the present invention, a semiconductor device comprises a semiconductor chip having a first side and an opposite second side, and a chip contact pad disposed on the first side of the semiconductor chip. A dielectric liner is disposed over the semiconductor chip. The dielectric liner comprises a plurality of openings over the chip contact pad. A interconnect contacts the semiconductor chip through the plurality of openings at the chip contact pad.

In accordance with an alternative embodiment of the present invention, a semiconductor device comprises a semiconductor chip having a first side and an opposite second side and a chip contact pad disposed on the first side of the semiconductor chip. The chip contact pad comprises a plurality of openings. A interconnect contacts the semiconductor chip through the plurality of openings at the chip contact pad.

In accordance with an alternative embodiment of the present invention, a method of forming a semiconductor device comprises providing a semiconductor chip having a first side and an opposite second side, and attaching the second side of the semiconductor chip to a conductive plate. The semiconductor chip has a chip contact pad on the first side. A dielectric liner is formed over the semiconductor chip. A portion of the dielectric liner over the first chip contact pad is patterned. An encapsulant is formed over the semiconductor chip. An interconnect is formed through the encapsulant and through the patterned portion of the dielectric liner to the chip contact pad.

In accordance with an alternative embodiment of the present invention, a method of forming a semiconductor device comprises providing a semiconductor chip having a first side and an opposite second side and attaching the second side of the semiconductor chip to a conductive plate. The semiconductor chip has a chip contact pad on the first side. A portion of the chip contact pad is patterned to form openings in the chip contact pad. The method further includes forming an encapsulant over the first semiconductor chip and forming a interconnect through the encapsulant and the openings of the first chip contact pad.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor device in accordance with an embodiment of the present invention, wherein FIG. 1A illustrates a cross-sectional view of the semiconductor device while FIG. 1B illustrates a sectional top view of the semiconductor device and FIG. 1C illustrates a top view;

FIG. 2, which includes

FIG. 3, which includes

FIG. 4, which includes

FIG. 5, which includes

FIG. 6, which includes

FIG. 9, which includes

FIG. 10, which includes FIGS. 10A-10E, illustrates a semiconductor device in accordance with an embodiment of the present invention in which the patterned dielectric liner forms segmented pad contacts, wherein FIG. 10A illustrates a cross-sectional view after wafer level processing, FIG. 10B-10D illustrate the corresponding plan view of the chip contact pad, and FIG. 10E illustrates the cross-sectional view of the semiconductor package after the formation of the contact interconnect;

FIG. 11, which includes FIGS. 11A-11D, illustrates a semiconductor device in accordance with an embodiment of the present invention in which the patterned dielectric liner is lifted off during the formation of the opening for contact interconnect, wherein FIG. 11A illustrates a cross-sectional view after wafer level processing, FIG. 11B-11C illustrate the corresponding plan view of the chip contact pad, and FIG. 11D illustrates the cross-sectional view of the semiconductor package after the formation of the contact interconnect;

FIG. 12, which includes FIGS. 12A-12E, illustrates a semiconductor device in accordance with an embodiment of the present invention in which a dielectric liner comprising two layers is used to form a patterned dielectric liner, wherein FIG. 12A illustrates a cross-sectional view after wafer level processing, FIG. 12B-12D illustrate the corresponding plan view of the chip contact pad, and FIG. 12E illustrates the cross-sectional view of the semiconductor package after the formation of the contact interconnect;

FIG. 13, which includes FIGS. 13A-13D, illustrates a semiconductor device in accordance with an alternative embodiment of the present invention in which a dielectric liner comprising two layers is used to form a patterned dielectric liner, wherein FIG. 13A illustrates a cross-sectional view after wafer level processing, FIG. 13B-13C illustrate the corresponding plan view of the chip contact pad, and FIG. 13D illustrates the cross-sectional view of the semiconductor package after the formation of the contact interconnect;

FIG. 14, which includes FIGS. 14A-14E, illustrates a semiconductor device in accordance with an embodiment of the present invention in which each substructure comprising a patterned chip contact area is coupled to an underlying via, wherein FIG. 14A illustrates a cross-sectional view after wafer level processing, FIG. 14B-14D illustrate the corresponding plan view of the chip contact pad, and FIG. 14E illustrates the cross-sectional view of the semiconductor package after the formation of the contact interconnect;

FIG. 15, which includes FIGS. 15A-15D, illustrates a semiconductor device in accordance with an embodiment of the present invention in which the patterned chip contact pad is coupled through an outer rim, wherein FIG. 15A illustrates a cross-sectional view after wafer level processing, FIG. 15B-15C illustrate the corresponding plan view of the chip contact pad, and FIG. 15D illustrates the cross-sectional view of the semiconductor package after the formation of the contact interconnect; and FIG. 16, which includes FIGS. 16A-16D, illustrates a semiconductor device in accordance with an alternative embodiment of the present invention in which the patterned chip contact pad is coupled through an outer rim, wherein FIG. 16A illustrates a cross-sectional view after wafer level processing, FIG. 16B-16C illustrate the corresponding plan view of the chip contact pad, and FIG. 16D illustrates the cross-sectional view of the semiconductor package after the formation of the contact interconnect.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of the invention will be described using FIG. 1. Alternative structural embodiments of the present invention will be described using FIGS. 2G, 2H, 3E, 4F, 5B, 6C, 7E, 8D, and 9-16. A method of fabricating the semiconductor device will be described using FIG. 2. Alternative embodiments of fabricating the semiconductor device will be described using FIGS. 3, 4, 5, 6, 7, 8, 10-16.

Figure 1A:
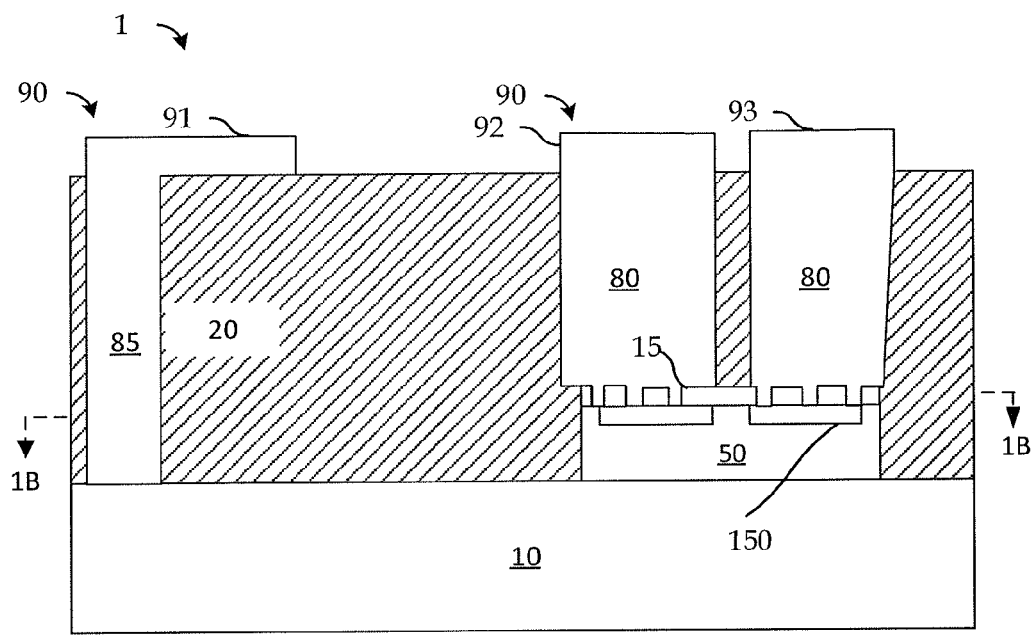
Figure 1B:
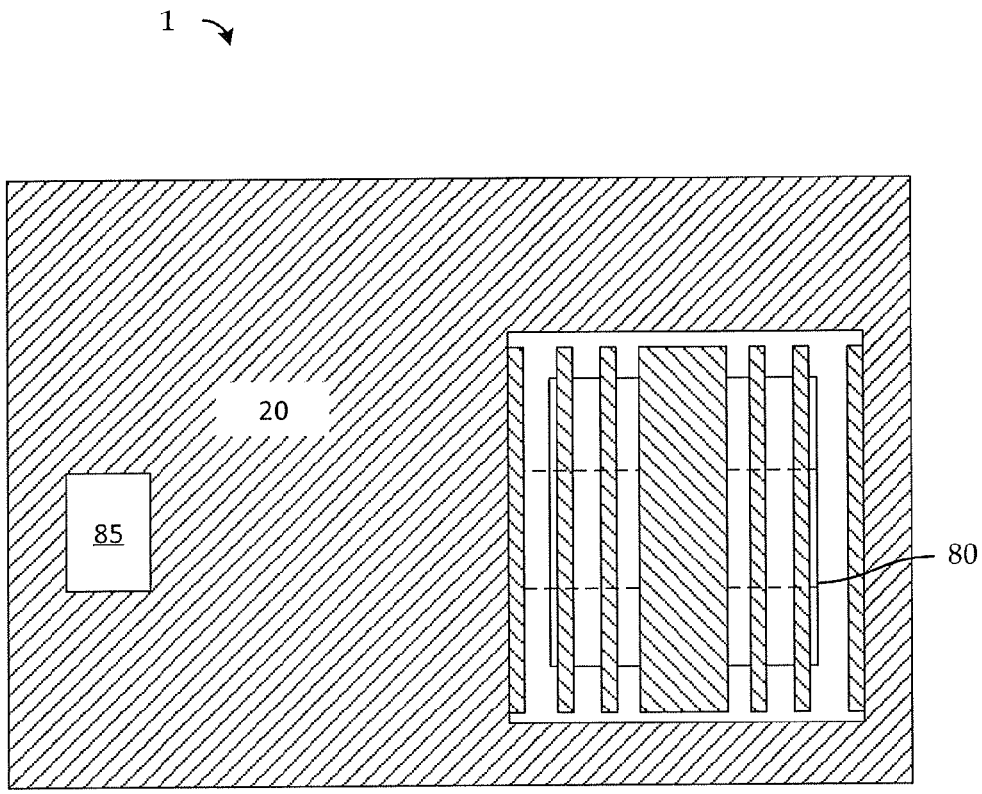
Figure 1C:
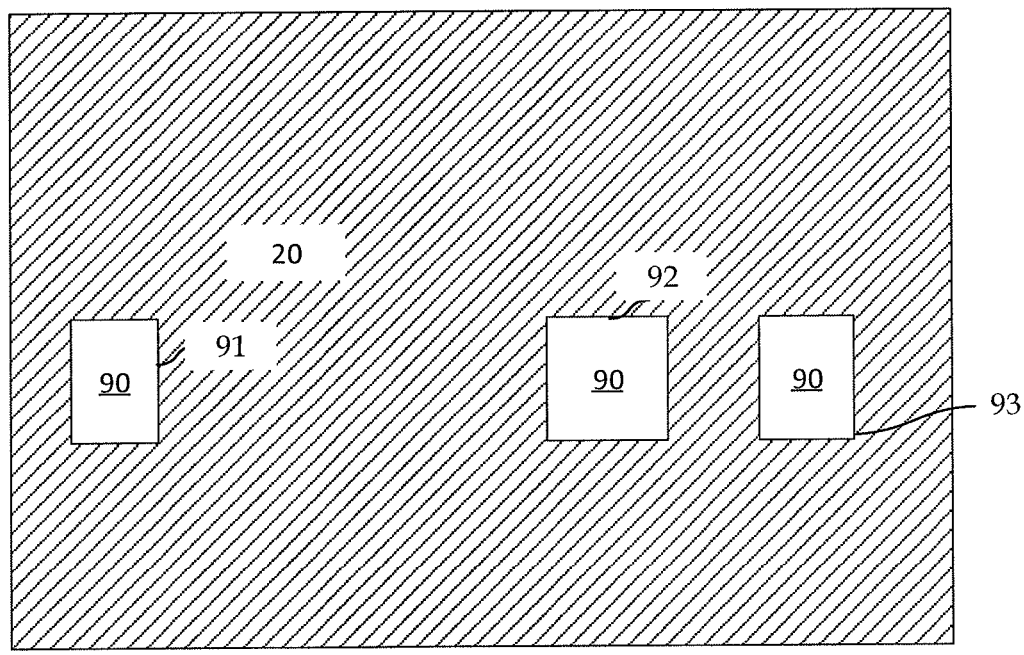

FIG. 1, which includes FIGS. 1A-1C, illustrates a semiconductor device in accordance with an embodiment of the present invention. FIG. 1A illustrates a cross-sectional view of the semiconductor device while FIG. 1B illustrates a sectional top view of the semiconductor device and FIG. 1C illustrates a top view.

Referring to FIG. 1A, the semiconductor device may be a semiconductor module 1 comprising a semiconductor chip 50.

In various embodiments, the semiconductor chip 50 may comprise an integrated circuit chip or a discrete device. In one or more embodiments, the semiconductor chip 50 may comprise a logic chip, a memory chip, an analog chip, a mixed signal chip, a discrete device and combinations thereof such as a system on chip. The semiconductor chip 50 may comprise various types of active and passive devices such as diodes, transistors, thyristors, capacitors, inductors, resistors, optoelectronic devices, sensors, micro-electro-mechanical systems, and others.

In various embodiments, the semiconductor chip 50 is attached to a conductive substrate 10. The conductive substrate 10 comprises copper in one embodiment. In other embodiments, the conductive substrate 10 comprises a metallic material which may include conductive metals and their alloys. The conductive substrate 10 may also include intermetallic material if they are conducting. The conductive substrate 10 may comprise a lead frame in one embodiment. For example, in one embodiment the conductive substrate 10 may comprise a die paddle over which the semiconductor chip 50 may be attached. In further embodiments, as will be described with respect to FIG. 7, the conductive substrate 10 may comprise one or more die paddles over which one or more chips may be attached.

In further alternative embodiments, the substrate 10 may not be conductive. In these embodiments, the electrical contact to the substrate 10 is obsolete.

In various embodiments, several different or identical chips 50 may be attached on the substrate 10 by different means.

In various embodiments, the semiconductor chip 50 may be formed on a silicon substrate. Alternatively, in other embodiments, the semiconductor chip 50 may have been formed on silicon carbide (SiC). In one embodiment, the semiconductor chip 50 may have been formed at least partially on gallium nitride (GaN).

In various embodiments, the semiconductor chip 50 may comprise a power semiconductor device, which may be a discrete device in one embodiment. In one embodiment, the semiconductor chip 50 is a two terminal device such as a PIN diode or a Schottky diode. In one or more embodiments, the semiconductor chip 50 is a three terminal device such as a power metal insulator semiconductor field effect transistor (MISFET), a junction field effect transistor (JFET), bipolar junction transistor (BJT), an insulated gate bipolar transistor (IGBT), or a thyristor.

In various embodiments, the semiconductor chip 50 comprises a thickness less than 100 µm. In alternative embodiments, the semiconductor chip 50 comprises a thickness less than 50 µm. In alternative embodiments, the semiconductor chip 50 comprises a thickness less than 20 µm.

In various embodiments, the semiconductor chip 50 comprises a thickness between about 10 µm to about 100 µm. In alternative embodiments, the semiconductor chip 50 comprises a thickness between about 10 µm to about 30 µm. In further alternative embodiments, the semiconductor chip 50 comprises a thickness between about 30 µm to about 40 µm.

The semiconductor chip 50 is embedded within an encapsulant 20 in various embodiments. In various embodiments, the encapsulant 20 comprises a dielectric material and may comprise a mold compound in one embodiment. In one or more embodiments the encapsulant 20 may comprise an imide. In other embodiments, the encapsulant 20 may comprise one or more of a polymer, a copolymer, a biopolymer, a fiber impregnated polymer (e.g., carbon or glass fibers in a resin), a particle filled polymer, and other organic materials. In one or more embodiments, the encapsulant 20 comprises a sealant not formed using a mold compound, and materials such as epoxy resins and/or silicones. In various embodiments, the encapsulant 20 may be made of any appropriate duroplastic, thermoplastic, a thermosetting material, or a laminate. The material of the encapsulant 20 may include filler materials in some embodiments. In one embodiment, the encapsulant 20 may comprise epoxy material and a fill material comprising small particles of glass or other electrically insulating mineral filler materials like alumina or organic fill materials.

In various embodiments, the encapsulant 20 comprises a thickness of about 20 µm to about 100 µm. In alternative embodiments, the encapsulant 20 comprises a thickness of about 50 µm to about 80 µm. In further alternative embodiments, the encapsulant 20 comprises a thickness of about 20 µm to about 50 µm. Alternatively, a thinner encapsulant 20 may be used in some embodiments. In such embodiments, the encapsulant 20 comprises a thickness of about 10 µm to about 20 µm.

The semiconductor module 1 comprises a plurality of contact pads 90 for mounting the semiconductor module 1 over a circuit board in some embodiments. As an illustration, the plurality of contact pads 90 includes a first contact pad 91, a second contact pad 92, and a third contact pad 93, which together form the contacts for the semiconductor chip 50.

The second contact pad 92 of the plurality of contact pads 90 and the third contact pad 93 of the plurality of contact pads 90 may be coupled to a front side of the semiconductor chip 50. For example, the second contact pad 92 and the third contact pad 93 are coupled to chip contact pads 150 on the semiconductor chip 50. In various embodiments, the plurality of contact pads 90 comprising the second contact pad 92 and the third contact pad 93 are coupled to the chip contact pads 150 using contact interconnects 80. The contact interconnects 80 are disposed within the encapsulant 20.

The first contact pad 91 of the plurality of contact pads 90 may be coupled to a back side of the semiconductor chip 50. For example, in one or more embodiments, the first contact pad 91 may be coupled using one or more through encapsulant via 85 disposed in the encapsulant 20.

In various embodiments, the contact pads 90 form a redistribution layer. It is understood that several levels of redistribution layers can be formed in the package on both sides of the substrate 10.

In various embodiments, the contact interconnects 80 are coupled to the semiconductor chip 50 through a patterned layer as illustrated in FIG. 1A. Each contact interconnect 80 is coupled through segments of the dielectric liner 15. The patterned layer comprises a patterned dielectric liner 15 in one embodiment. The dielectric liner 15 may comprise a nitride in one or more embodiments. In other embodiments, the dielectric liner 15 may comprise other dielectric materials such as an oxide, silicon carbide, silicon oxide nitride, hafnium oxide, aluminum oxide, other high dielectric constant materials, other low dielectric constant materials, polyimide, and other organic materials.

In the illustrated embodiment, the liner 15 is formed only over the semiconductor chip 50. However, in some alternative embodiments, the liner 15 is formed over both the semiconductor chip 50 and the substrate 10. As illustrated in FIG. 1B, in one embodiment the patterned layer forms a plurality of trenches in the dielectric liner 15, which covers the semiconductor chip 50. In alternative embodiments, the patterned layer forms a plurality of squares, or pillars, or circles.

FIG. 2, which includes FIGS. 2A-2I, illustrates a semiconductor device during various stages of fabrication in accordance with embodiments of the present invention.

Figure 2A:
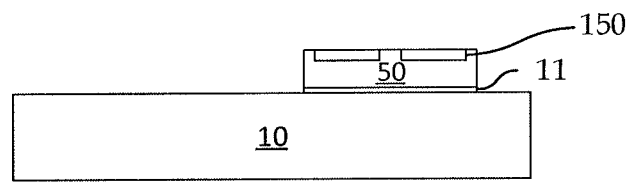
FIGS. 2A-2I, illustrates a semiconductor device during various stages of fabrication in accordance with embodiments of the present invention.

Referring to FIG. 2A, a semiconductor chip 50 is attached to a substrate 10. In various embodiments, the processes described in FIG. 2 may be performed for each semiconductor chip sequentially or in alternative embodiments, a plurality of semiconductor packages may be formed by using a strip or substrate 10 comprising a plurality of conductive plates. Alternatively, the substrate 10 may comprise a polymer substrate.

In various embodiments, the semiconductor chip 50 may comprise an integrated circuit chip or a discrete device. The semiconductor chip 50 comprises a plurality of chip contact pads 150 on a first side of the semiconductor chip 50. In some embodiments, the semiconductor chip 50 may also have contact pads on the opposite second side of the semiconductor chip 50. For example, the semiconductor chip 50 may be a discrete vertical device having contact pads on both sides.

The semiconductor chip 50 may be formed within a semiconductor wafer and singulated. In various embodiments, the semiconductor wafer is thinned prior to or after the singulation process. Thus, in various embodiments, the semiconductor chip 50 has a thickness of about 10 µm to about 100 µm, and about 30 µm to about 50 µm in one embodiment.

In various embodiments, the semiconductor chip 50 may be attached to the substrate 10 using a solder process. In one or more embodiments, the semiconductor chip 50 is attached to the substrate 10 using a diffusion bonding process.

In various embodiments, the semiconductor chip 50 may be attached to the substrate 10 using a die attach layer 11, which may be insulating in one embodiment. In some embodiments, the die attach layer 11 may be conductive, for example, may comprise a nano-conductive paste. In alternative embodiments, the die attach layer 11 is a solderable material. For example, the die attach layer 11 may be applied onto the semiconductor chip 50 and soldered to the substrate 10 in one embodiment.

In one alternative embodiment, the die attach layer 11 comprises a polymer such as a cyanide ester or epoxy material and may comprise silver particles. In one embodiment, the die attach layer 11 may be applied as conductive particles in a polymer matrix so as to form a composite material after curing. In an alternative embodiment, a conductive nano-paste such as a silver nano-paste may be applied. Alternatively, in another embodiment, the die attach layer 11 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the die attach layer 11.

The die attach layer 11 may be dispensed in controlled quantities under the semiconductor chip 50. An die attach layer 11 having a polymer may be cured at about 125° C. to about 200° C. while solder based die attach layer 11 may be cured at 250° C. to about 350° C. Using the die attach layer 11, the semiconductor chip 50 is attached to the substrate 10, which may be a die paddle of a leadframe in one embodiment.

Figure 2B:
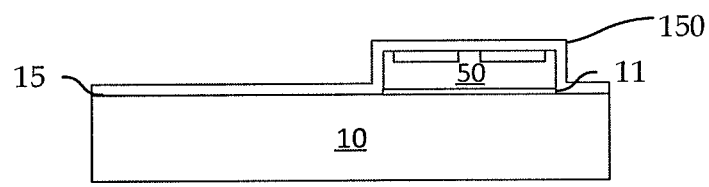

Referring to FIG. 2B, a liner 15 is deposited over the substrate 10 on the semiconductor chip 50. In various embodiments, the liner 15 may comprise a nitride material. In alternative embodiments, the liner 15 may comprise an oxide. In further embodiments, the liner 15 may comprise other suitable materials such as silicon oxy-nitride, hafnium oxide, silicon carbide, organic dielectric materials and others. In other embodiments, the liner 15 is disposed over the chip 50 only.

In various embodiments, the liner 15 may be deposited using a vapor deposition process such as chemical vapor deposition, physical vapor deposition, plasma enhanced physical vapor deposition including high density plasma processes or atomic layer deposition processes. In other embodiments, an organic material is deposited by spray, print or spin-on processes. In various embodiments, the thickness of the liner 15 after the deposition is about 100 nm to about 300 nm. In alternative embodiments, the thickness of the liner 15 after the deposition is about 1 nm to about 40 nm. In one or more embodiments, the thickness of the liner 15 after the deposition is about 5 nm to about 20 nm. In one or more embodiments, the thickness of the liner 15 after the deposition is about 40 nm to about 100 nm.

Figure 2D:
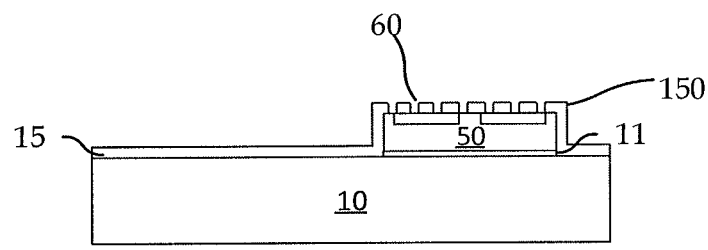
Figure 2E:
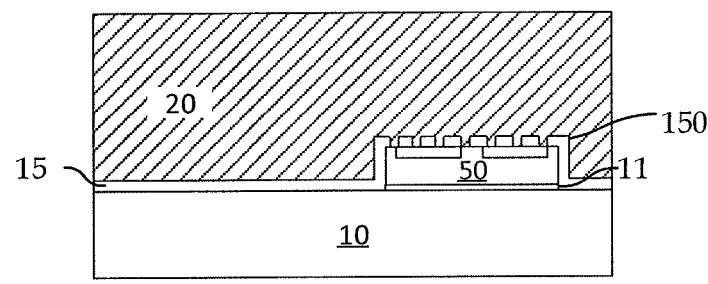
Figure 2C:
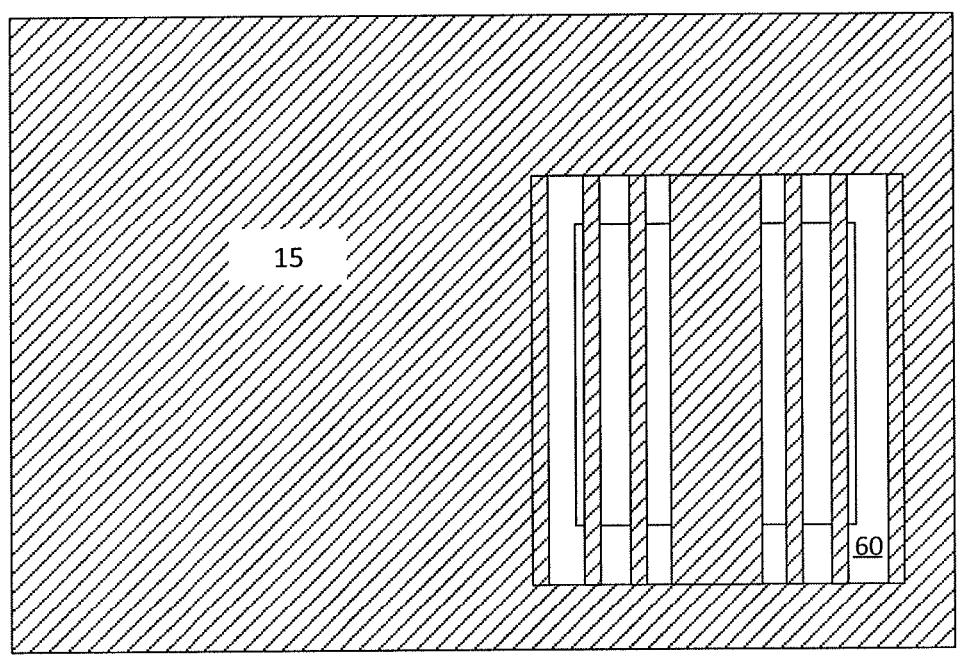

The liner 15 is patterned as illustrated in FIGS. 2C and 2D. FIG. 2C is a top view while FIG. 2D is a cross-sectional view. In one or more embodiments, the liner 15 is removed over the substrate 10 or patterned over the substrate 10.

Referring to FIG. 2D, the liner 15 is patterned in a region above the semiconductor chip 50 in various embodiments. In one or more embodiments, the liner 15 directly above the chip contact pad 150 is patterned forming the plurality of openings 60 separated by segments of the liner 15 (FIG. 2C). In some embodiments, the semiconductor chip 50 may be tested for functionality through the plurality of openings 60 in the liner 15. In one or more embodiments, the plurality of openings 60 separated by segments having a length about 10 μm to about 2 μm to 10 μm. In other embodiments, the dielectric segments have an extension in one direction of 5 μm to 20 μm. Similarly, the plurality of openings 60 comprise openings having a dimension of about 2 μm to about 10 μm. In other embodiments, the openings 60 have a dimension in one direction of 5 to 20 μm.

As next illustrated in FIG. 2E, an encapsulant 20 is applied over the (or plurality of) semiconductor chip 50 and partially encloses the semiconductor chip 50. In one embodiment, the encapsulant 20 is applied using a molding process such as compression molding, transfer molding process, injection molding, granulate molding, powder molding, liquid molding, as well as printing processes such as stencil or screen printing.

In various embodiments, the encapsulant 20 comprises a dielectric material as described previously with respect to FIG. 1. In one embodiment, the encapsulant 20 comprises an imide. The encapsulant 20 may be cured, i.e., subjected to a thermal process to harden thus forming a hermetic seal protecting the semiconductor chip 50.

In various embodiments, the encapsulant 20 may have a thickness of about 20 μm to about 70 μm, and about 50 μm to about 100 μm in one embodiment.

Figure 2F:
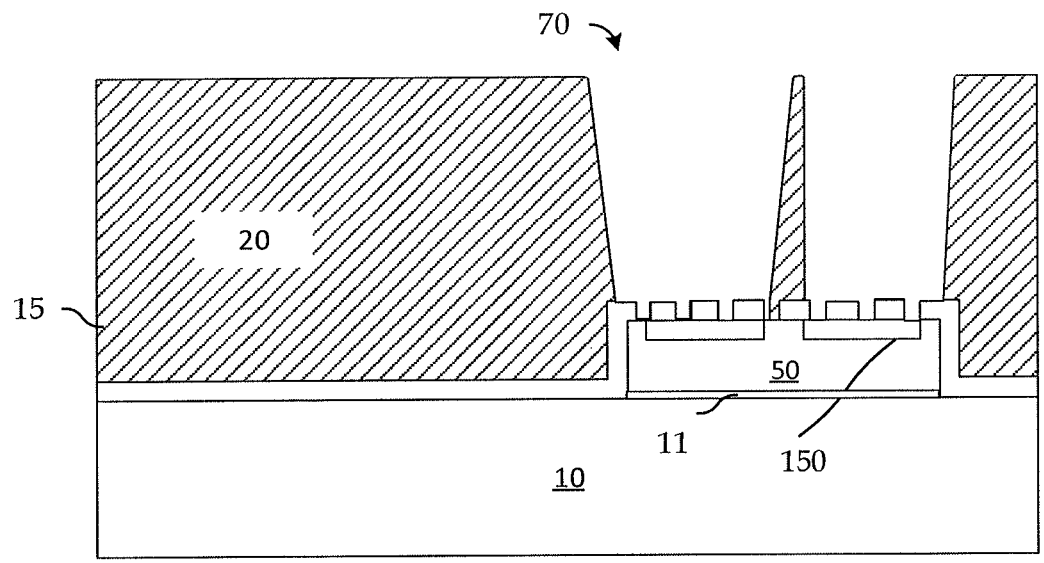

Referring to FIG. 2F, a plurality of contact openings 70 are formed within the encapsulant 20. The contact openings 70 extend from the top surface of the encapsulant 20 to the chip contact pad 150. A plurality of through via openings may also be formed within the encapsulant 20 to the substrate 10. The through via openings may extend from the top surface of the encapsulant 20 to the substrate 10 through the opposite bottom surface of the encapsulant 20 and through the liner 15.

In one or more embodiments, the plurality of contact openings 70 and the plurality of through via openings are formed using a laser process. For example, a laser drill may be used to structure the encapsulant 20. In one embodiment, a pulsed carbon dioxide laser may be used for the laser drilling. In another embodiment, the laser drilling may comprise a Nd:YAG laser. In an alternative embodiment, the plurality of contact openings 70 and the plurality of through via openings are formed after a conventional lithography process, for example, using a plasma etching process.

In various embodiments, the plurality of contact openings 70 comprises a maximum diameter less than 200 μm. The plurality of contact openings 70 comprises a maximum diameter less than 80 μm in one or more embodiments. The plurality of contact openings 70 comprises a maximum diameter less than 300 μm in one embodiment. The plurality of contact openings 70 comprises a maximum diameter of about 50 μm to about 150 μm in various embodiments.

Figure 2G:
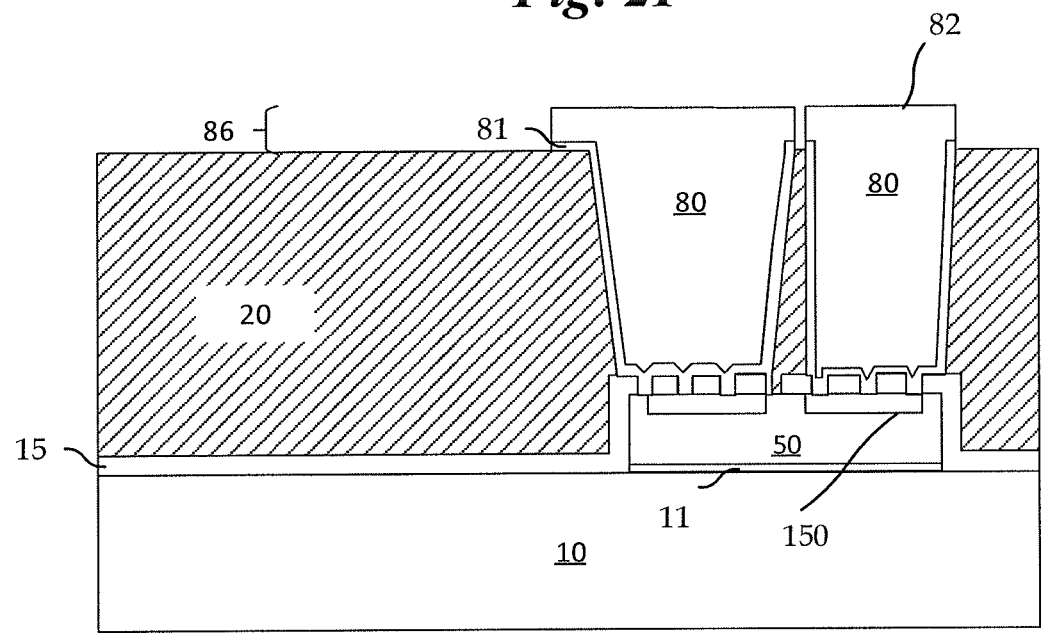

Referring to FIG. 2G, the plurality of contact openings 70 and the plurality of through via openings are filled with a conductive material.

As next illustrated in FIG. 2G, a metal liner 81 may be formed within the plurality of contact openings 70 and the plurality of through via openings. The metal liner 81 may fill the plurality of openings 60 in the dielectric liner 15 in some embodiments. Alternatively, the metal liner 81 may line the plurality of contact openings 70. The metal liner 81 may comprise a diffusion barrier material and may also comprise a seed layer for subsequent electroplating or electroless plating. As an example, the metal liner 81 may comprise a stack of metals, metal nitrides (e.g., TiN, TaN) followed by a seed layer (e.g., Cu) in one embodiment. In another embodiment, only a seed layer may be deposited.

The metal liner 81 may be deposited, for example, using sputter deposition in one embodiment. In one embodiment, the metal liner 81 may be deposited using radio frequency (RF) magnetron sputtering. In alternative embodiments, the metal liner 81 may comprise a layer of Ta, TaN, W, WN, WCN, WSi, Ti, WTi, TiN and/or Ru as examples. The seed layer may be deposited conformally over the diffusion barrier material, for example, using a plasma vapor deposition (PVD) sputtering or a metal-organic chemical vapor deposition (MOCVD) process. In various embodiments, the seed layer comprises the same material as the material to be deposited using a electroplating or an electroless deposition process. The seed layer comprises copper in one embodiment. In another embodiment, the seed layer may be deposited by means of a conductive polymer.

A conductive fill material 82 is filled within the plurality of contact openings 70 and the plurality of through via openings. In various embodiments, the conductive fill material 82 is deposited using an electrochemical deposition process such as electroplating. Alternatively, the conductive fill material 82 may be deposited using an electroless deposition process.

In one or more embodiments, the conductive fill material 82 may comprise copper, aluminum, and such others. In other embodiments, the conductive fill material 82 may comprise tungsten, titanium, tantalum, ruthenium, nickel, cobalt, platinum, gold, silver, and such other materials. In various embodiments, the conductive fill material 82 material that may be electrodeposited. Thus, after depositing the conductive fill material 82, a conductive layer 86 is formed over the encapsulant 20. This layer 86 forms conductive pads and a redistribution layer to allow electrical routing between different chips.

In an alternative embodiment, a wire may be inserted through the plurality of contact openings 70 to and attached, for example, using a soldering process to form a wire bond.

Figure 2H:
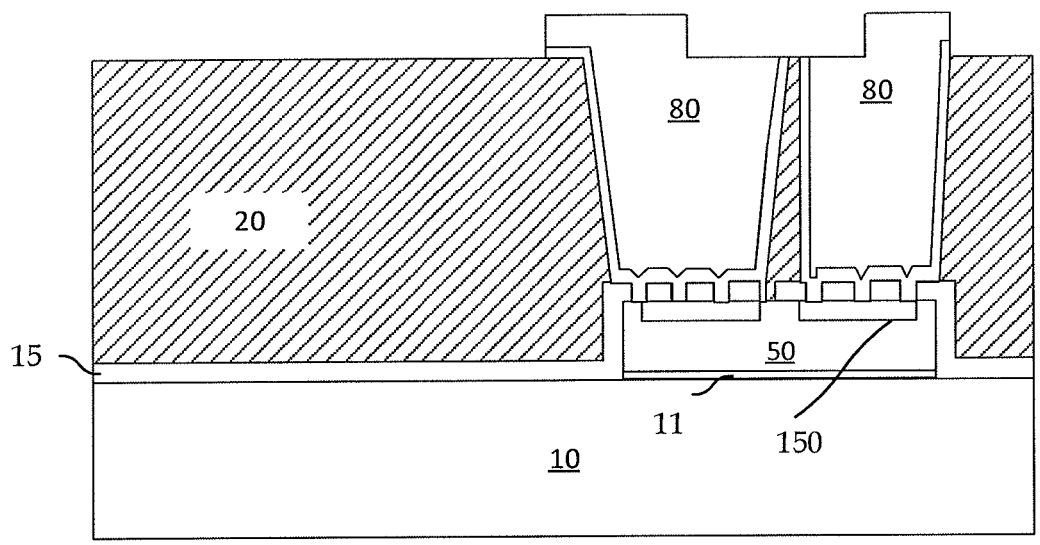

As next illustrated in FIG. 2H, the conductive fill material 82 is structured to form contact interconnects 80 and through substrate openings. The contact interconnects 80 are thus formed within the plurality of contact openings 70 while through substrate vias are formed within the plurality of through via openings. In various embodiments, the conductive fill material 82 may be structured using an etching process after a lithographic process.

Figure 2I:
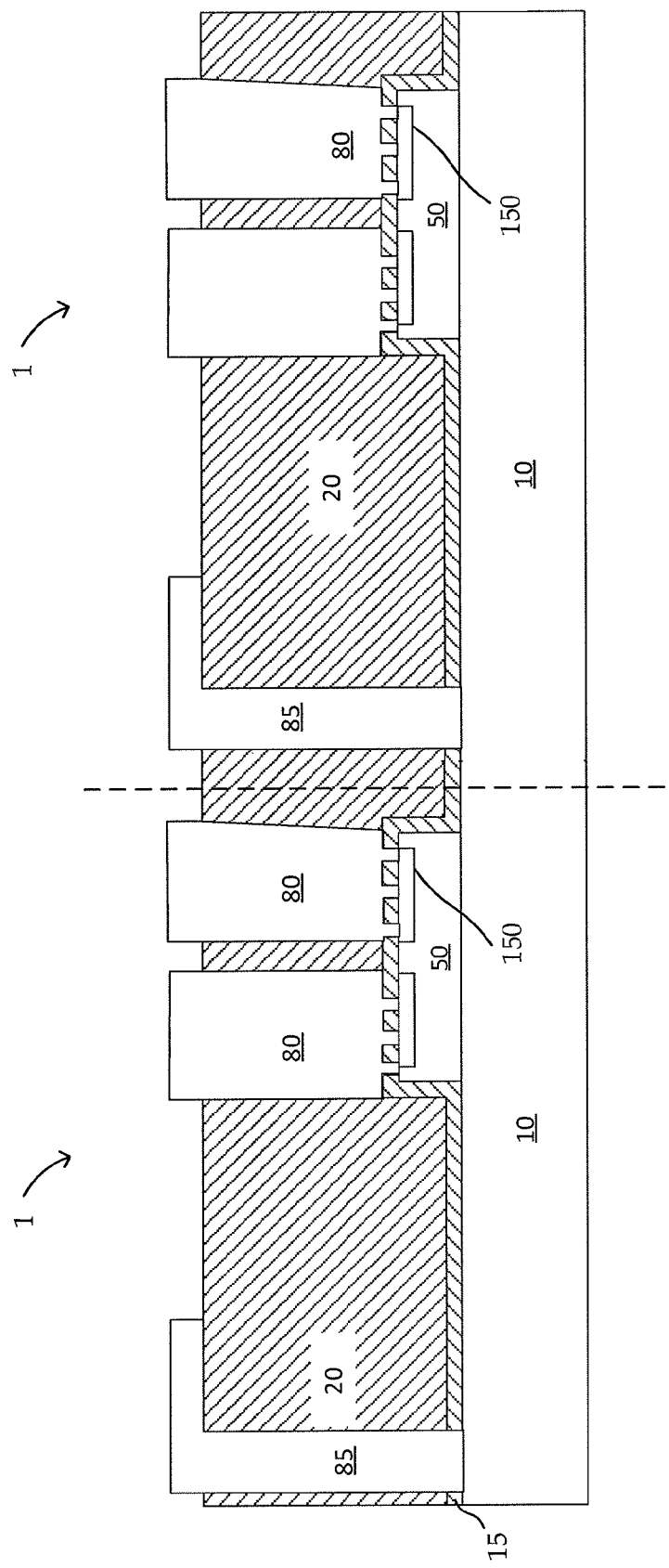

FIG. 2I illustrates an alternative embodiment in which the substrate 10 comprises a strip such as a leadframe strip. Thus, a plurality of semiconductor chips are attached and simultaneously processed. Thus, a strip of semiconductor packages are formed, which may be singulated, for example, mechanically. One or several chips 50 may be attached to each segment of the strip to form a multi chip package.

Further processing may also continue in various embodiments which may include forming back side and front side redistribution layers.

FIG. 3, which includes FIGS. 3A-3E, illustrates a semiconductor device during various stages of processing in accordance with an alternative embodiment of the invention.

Figure 3A:
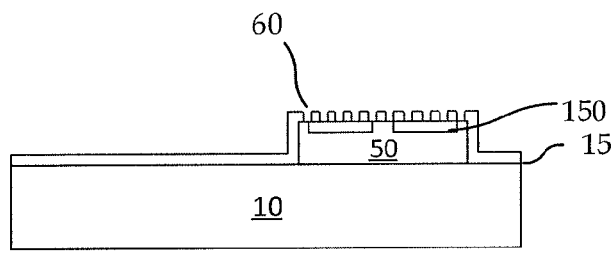
FIGS. 3A-3E, illustrates a semiconductor device during various stages of processing in accordance with an alternative embodiment of the invention.

Referring to FIG. 3A, in contrast to the prior embodiment, in this embodiment the liner 15 is patterned into smaller segments. In other words, in this embodiment, the plurality of openings 60 are spaced apart closer than the embodiments described in FIG. 2.

Figure 3C:
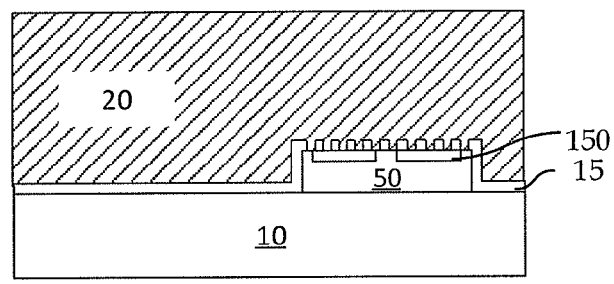
Figure 3B:
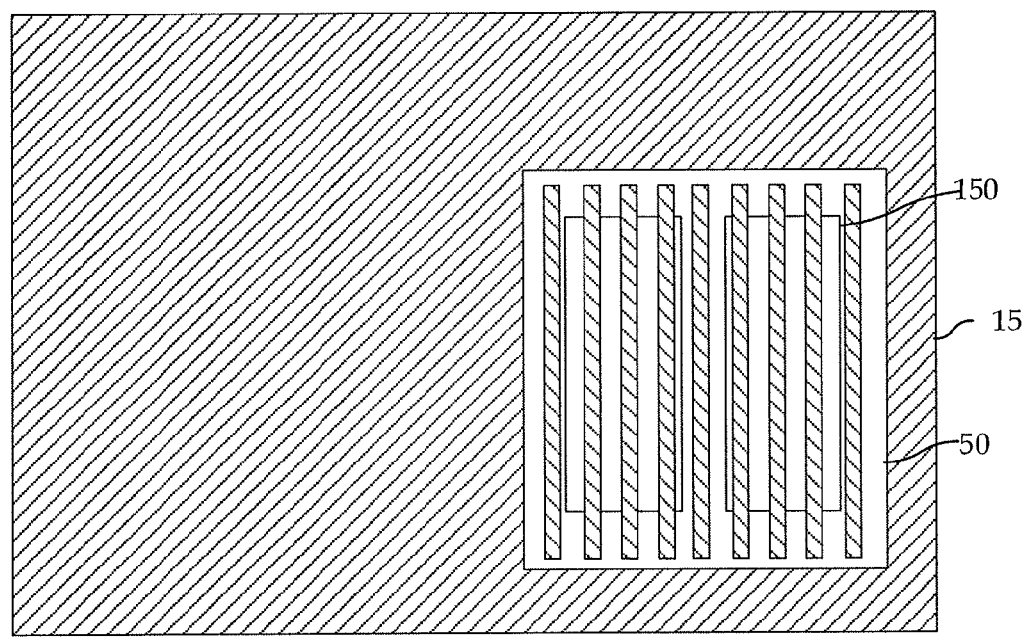

FIG. 3B and FIG. 3C illustrates the semiconductor device after forming the encapsulant 20. FIG. 3B illustrates a top view while FIG. 3C illustrates a cross-sectional view.

Figure 3D:
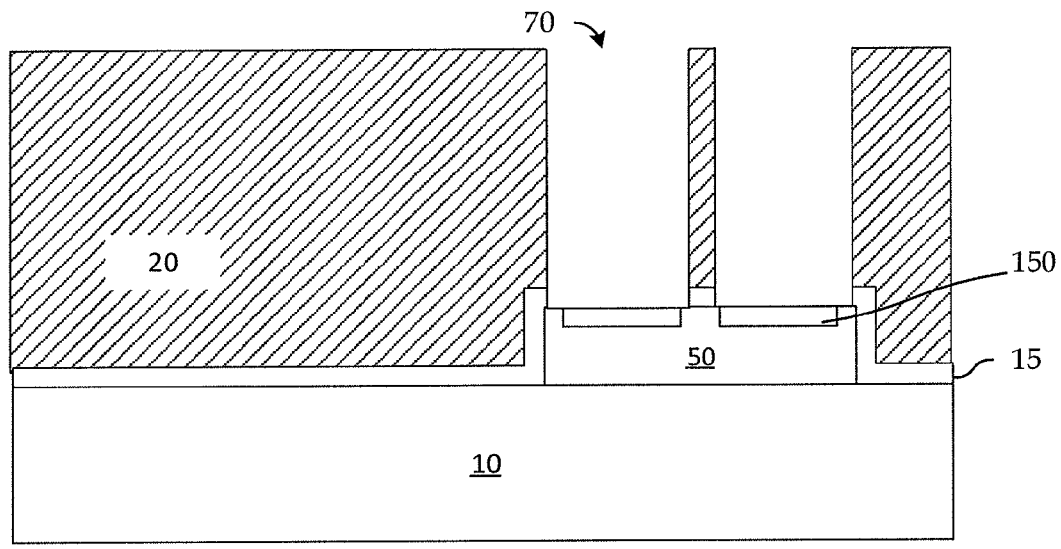
Figure 3E:
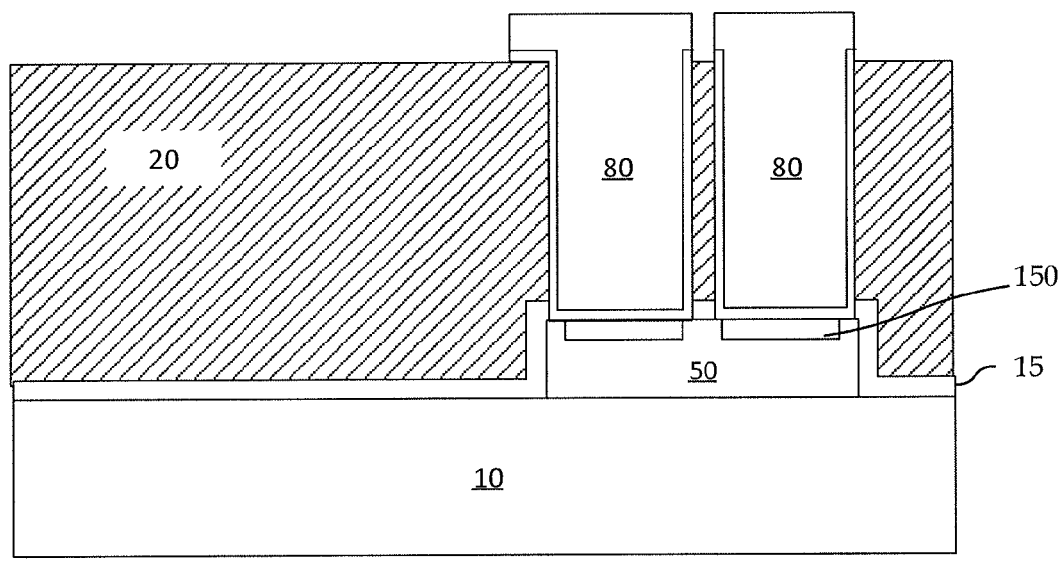

FIG. 3D illustrates the semiconductor device after the formation of the contact openings. As illustrated in FIG. 3D, a plurality of contact openings 70 are formed in the encapsulant 20. Unlike the prior embodiment described in FIG. 2, the liner 15 forming the plurality of openings 60 is removed while forming the plurality of contact openings 70. For example, the laser drilling of the encapsulant 20 may remove the liner 15. Alternatively, a wet etch process used to clean the plurality of contact openings 70 after the laser drilling process may lift off the liner 15. Consequently, as illustrated in FIG. 3E, the contact interconnects 80 may directly contact the chip contact pads 150. In other words, unlike the prior embodiment, the contact interconnects 80 contact the semiconductor chip 50 directly through a large opening in the liner 15.

FIG. 4, which includes FIGS. 4A-4F, illustrates a semiconductor device during fabrication in accordance with an alternative embodiment of the present invention.

In this embodiment, the chip contact pads 150 are themselves segmented. In this embodiment, the metal layer M4 and via layer V4 may be formed by a dual damascene process or a via and a single damascene process. In another embodiment, the metal layer M4 and the via layer V4 may be formed by a pattern plating process.

Figure 4A:
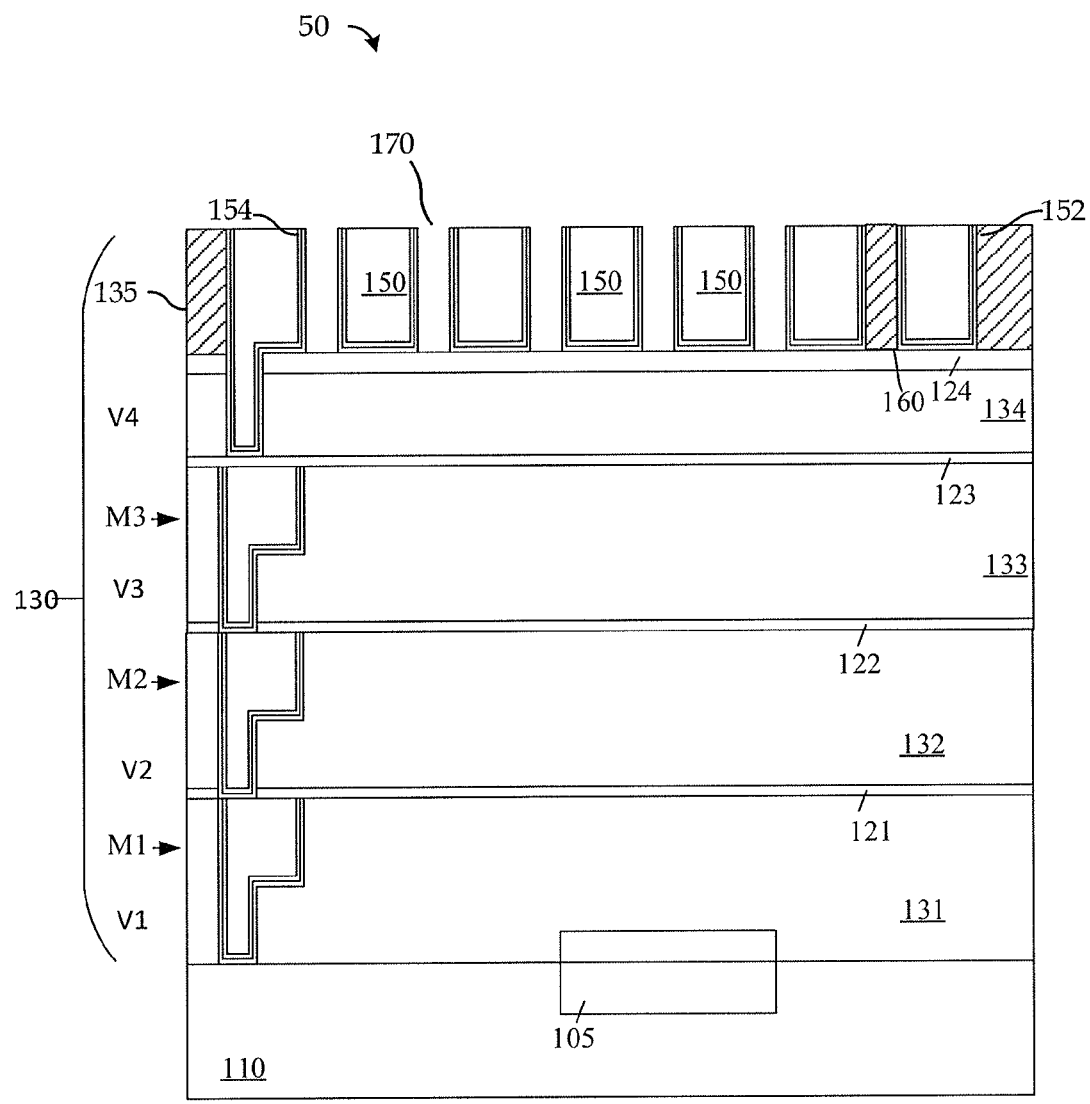
FIGS. 4A-4F, illustrates a semiconductor device during fabrication in accordance with an alternative embodiment of the present invention.

Referring to FIG. 4A, a segmented chip contact pad 150 is formed over a substrate 110. The substrate 110 may include active devices formed within. A set of metallization layers 130 is disposed over the substrate 110, which may comprise one or more levels of metal lines and vias in various embodiments. For example, the metallization layer 130 may comprise ten or more metal levels in one embodiment. In another embodiment, the layer 130 may comprise three metal layers. In another embodiment, the metallization layer 130 may comprise four or more metal levels. The metallization layer 130 may couple various devices within the semiconductor chip 50 in one embodiment. In another embodiment, the metallization layer 130 forms contacts to different regions of a discrete semiconductor device.

In various embodiments, the chip contact pad 150 is coupled to active devices in the substrate 110 such as a first device 105. The first device 105 may be a transistor, capacitor, diode, thyristor, and other devices in various embodiments. The chip contact pad 150 may be a top metallization layer of a multilevel metallization in one embodiment. A plurality of metal lines and vias disposed within the metallization layer 130 may couple the active devices in the substrate 110 with the chip contact pad 150.

FIG. 4A illustrates a four layer metallization having a first via level V1, a first metal level M1, a second via level V2, a second metal level M2, a third via level V3, a third metal level M3, a fourth via level V4 coupled to the chip contact pad 150. In one embodiment, the chip contact pad 150 is a metal level formed on the uppermost metal level of the semiconductor chip 50.

Each of the metallization level may include an inter level dielectric layer. For example, a first inter level dielectric layer 131 is deposited over the substrate 110. A second inter level dielectric layer is deposited over the first inter level dielectric layer 131. A third inter level dielectric layer 133 is deposited over the second inter level dielectric layer 132. A fourth inter level dielectric layer 134 is deposited over the third inter level dielectric layer 133. A fifth inter level dielectric layer 135 is deposited over the fourth inter level dielectric layer 134.

The inter level dielectric layers may be separated by etch stop liners. For example, a first etch stop liner 121 is deposited between the first and the second inter level dielectric layers 131 and 132. A second etch stop liner 122 is deposited between the second and the third inter level dielectric layers 132 and 133. Similarly, a third etch stop liner 123 is deposited between the third and the fourth inter level dielectric layers 133 and 134.

In the illustrated embodiments, the conductive features forming the metal lines and vias (e.g., in M1, V1, M2, V2, M3, V3) are formed using a dual damascene process. In alternative embodiments, the conductive features may be formed using a damascene process or a combination of single and dual damascene processes.

Each conductive feature may include a metal liner 102, which may include multiple layers. For example, the metal liner 102 may include a first metal liner 152 and a second metal liner 154 in some embodiments. The first metal liner 152 may be a diffusion barrier while the second metal liner 154 may be a seed layer.

Figure 4B:
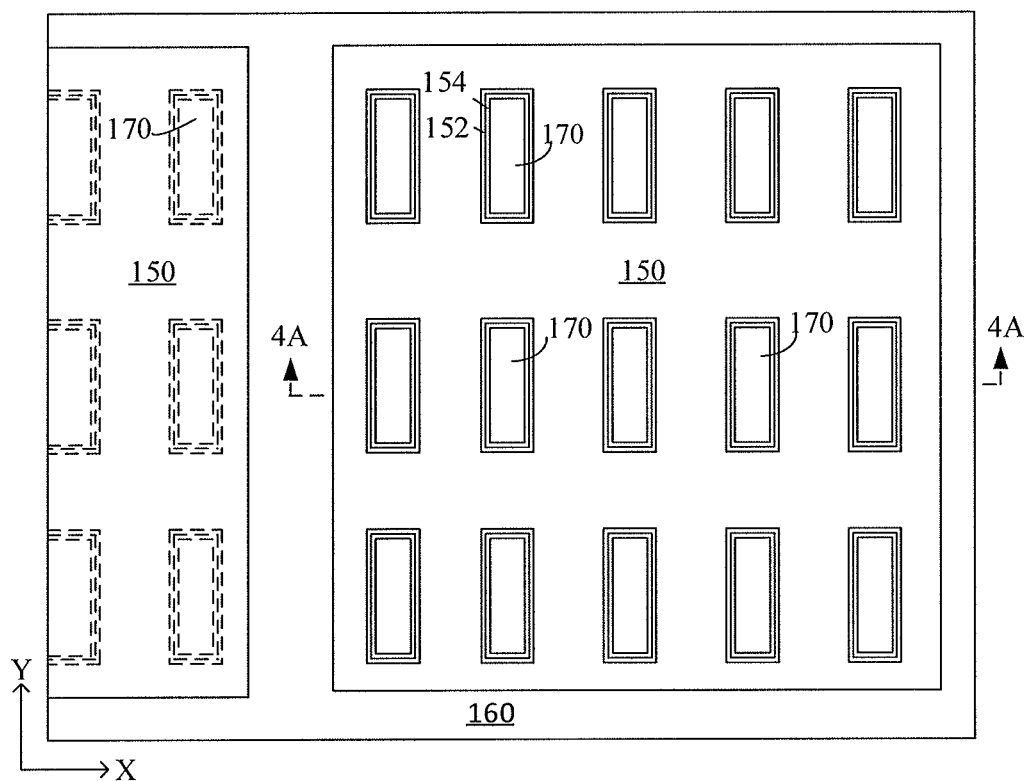

As illustrated in FIG. 4A, the chip contact pad 150 includes a plurality of pad openings 170. FIG. 4B illustrates a top view and shows that the plurality of pad openings 170 is dispersed within the chip contact pad 150. Each chip contact pad 150 may include an array of plurality of pad openings 170. FIG. 4B illustrates three rows and five columns only as an illustration. In various embodiments, more than ten openings may be formed within the chip contact pad 150 forming the array of the plurality of pad openings 170. FIG. 4B also illustrates that neighboring chip contact pads 150 may also include similar openings. Each contact sub-pad 150 may be electrically connected either by vias V4 to the lower metal layer M3 (e.g., FIG. 14) or by electrical inter-connection at Metal 4 (e.g., FIGS. 15-16).

Figure 4C:
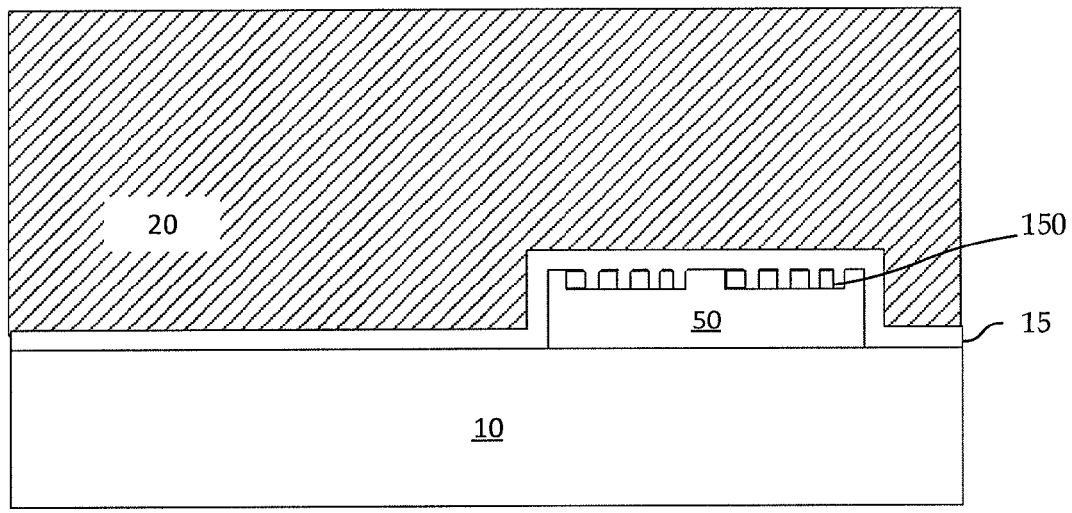

FIG. 4C illustrates a cross-sectional view of the semiconductor device after forming a liner and an encapsulant in accordance with an embodiment of the present invention.

An optional liner 15 is formed over the chip contact pad 150 followed by the formation of an encapsulant 20 as described in prior embodiments. The liner 15 may be skipped in various embodiments. In some embodiments, the liner 15 may be formed only over the semiconductor chip 50 as described in FIGS. 8 and 9. The liner 15 may be formed as a conformal liner over the plurality of pad openings 170. Alternatively, the liner 15 may completely or partially fill the plurality of pad openings 170.

Figure 4D:
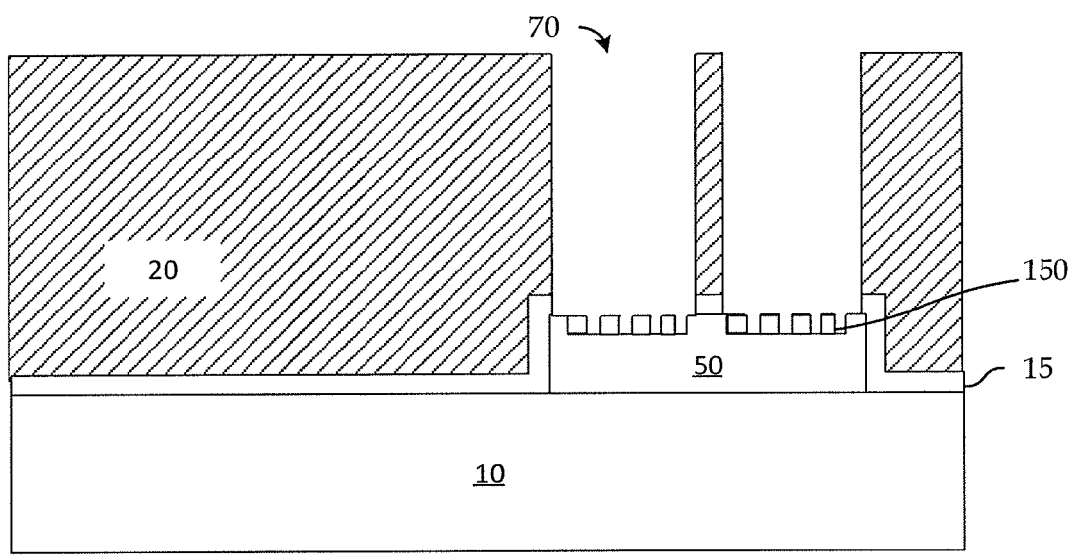

FIG. 4D illustrates a cross-sectional view of the semiconductor device after forming contact openings in accordance with an embodiment of the present invention.

As described in prior embodiments, contact openings 70 are formed within the encapsulant 20. The contact openings 70 may be formed after a lithography process, for example, using an anisotropic etch process. Alternatively, the contact openings 70 may be formed using an ablation process such as a laser ablation process. The liner 15 exposed after the removal of the encapsulant 20 may be removed using a wet etch process.

In other embodiments, the liner 15 is removed in the pad area 150 on wafer-level.

Figure 4E:
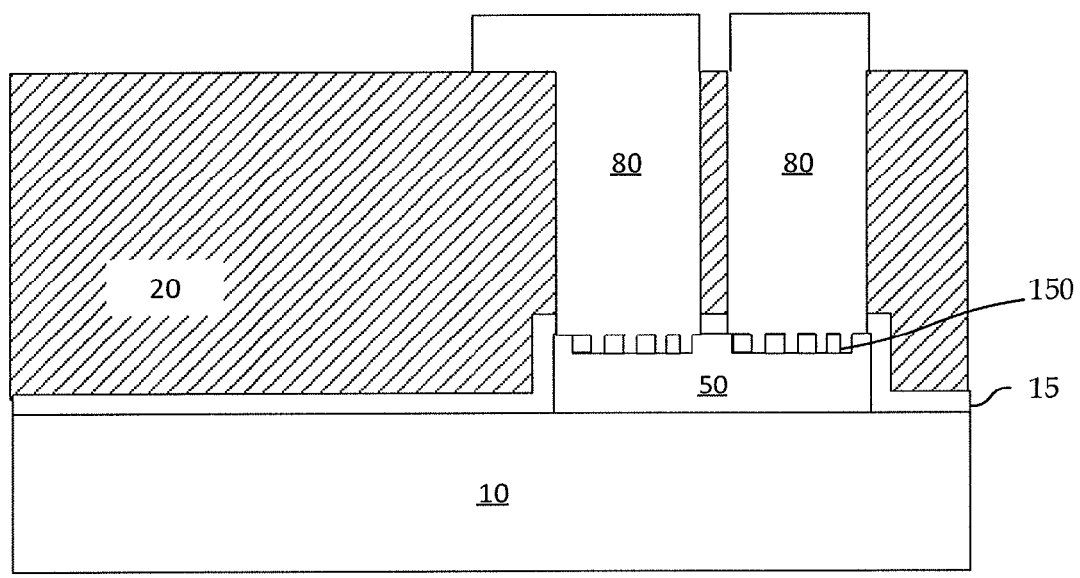
Figure 4F:
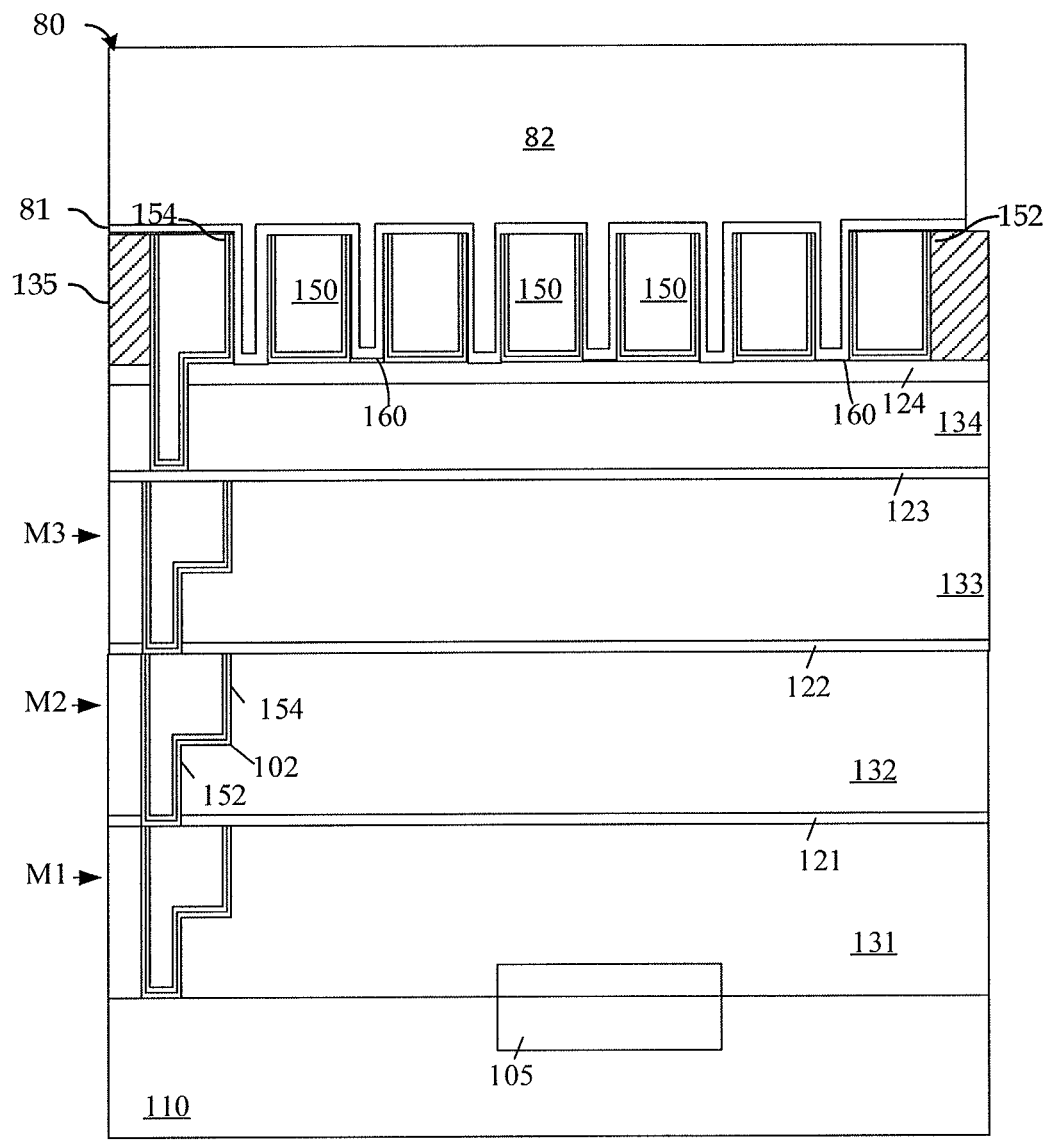

FIGS. 4E and 4F illustrates a cross-sectional view of the semiconductor device after filling the contact openings with a conductive material in accordance with an embodiment of the present invention. FIG. 4F illustrates a magnified cross-sectional view of the semiconductor device illustrated in FIG. 4E.

Referring to FIG. 4E, contact openings 70 are filled with a conductive material, which may include a metal liner 81 (FIG. 4F) and a conductive fill material 82 as described in prior embodiments. The metal liner 81 may comprise a diffusion barrier and a seed layer. The conductive fill material 82 may be filled, for example, using a plating process.

As illustrated in FIG. 4F, the conductive fill material 82 may fill the contact openings 70 (illustrated in FIG. 4D) and the plurality of pad openings 170 (illustrated in the magnified view of FIG. 4A). Alternatively, in some embodiments, only the metal liner 81 may fill the plurality of pad openings 170. Advantageously, in this embodiment, the contact interconnect 80 has an interlocking structure, which results in improved adhesion with the chip contact pad 150.

Figure 5A:
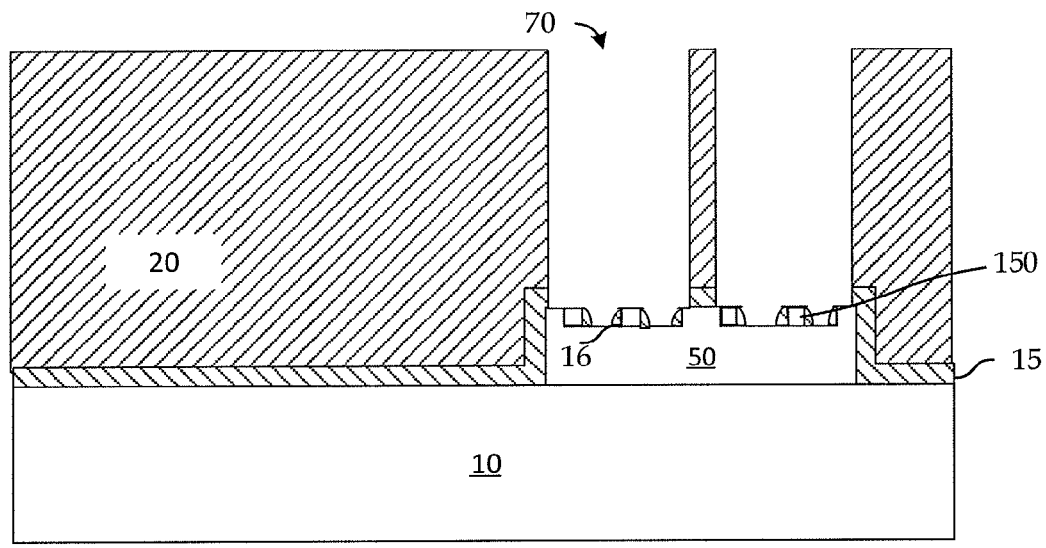
FIGS. 5A-5B, illustrates an alternative embodiment of the present invention in which the plurality of openings in the chip contact pad are spaced apart facilitating the formation of spacers.
Figure 5B:
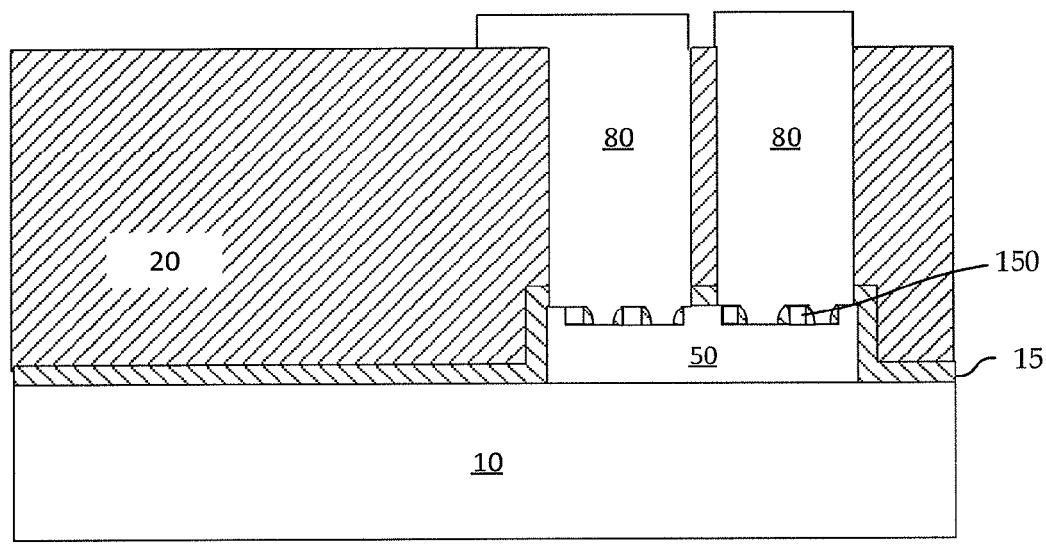

FIG. 5, which includes FIGS. 5A-5B, illustrates an alternative embodiment of the present invention in which the plurality of openings in the chip contact pad are spaced apart facilitating the formation of spacers.

FIG. 5A illustrates a cross-sectional view of the semiconductor device after forming contact openings in accordance with an embodiment of the present invention.

In this embodiment, the prior processing may proceed as described with respect to FIGS. 4A-4D. However, in some embodiments, the plurality of openings 170 of the chip contact pad 150 may be spaced apart. For example, the plurality of contact openings 70 may be formed through the encapsulant 20 using a laser process. However, the laser process may not remove the exposed liner 15, which may be removed subsequently using a wet etch process. In this embodiment, an anisotropic etch process is used to remove the liner 15, which leaves spacers 16 around the sidewalls of the plurality of pad openings 170 of the chip contact pad 150.

Referring to FIG. 5B, the plurality of pad openings 170 and the plurality of contact openings 70 are filled with a conductive material as described in prior embodiments. Subsequent processing may proceed as in conventional processing.

Figure 6A:
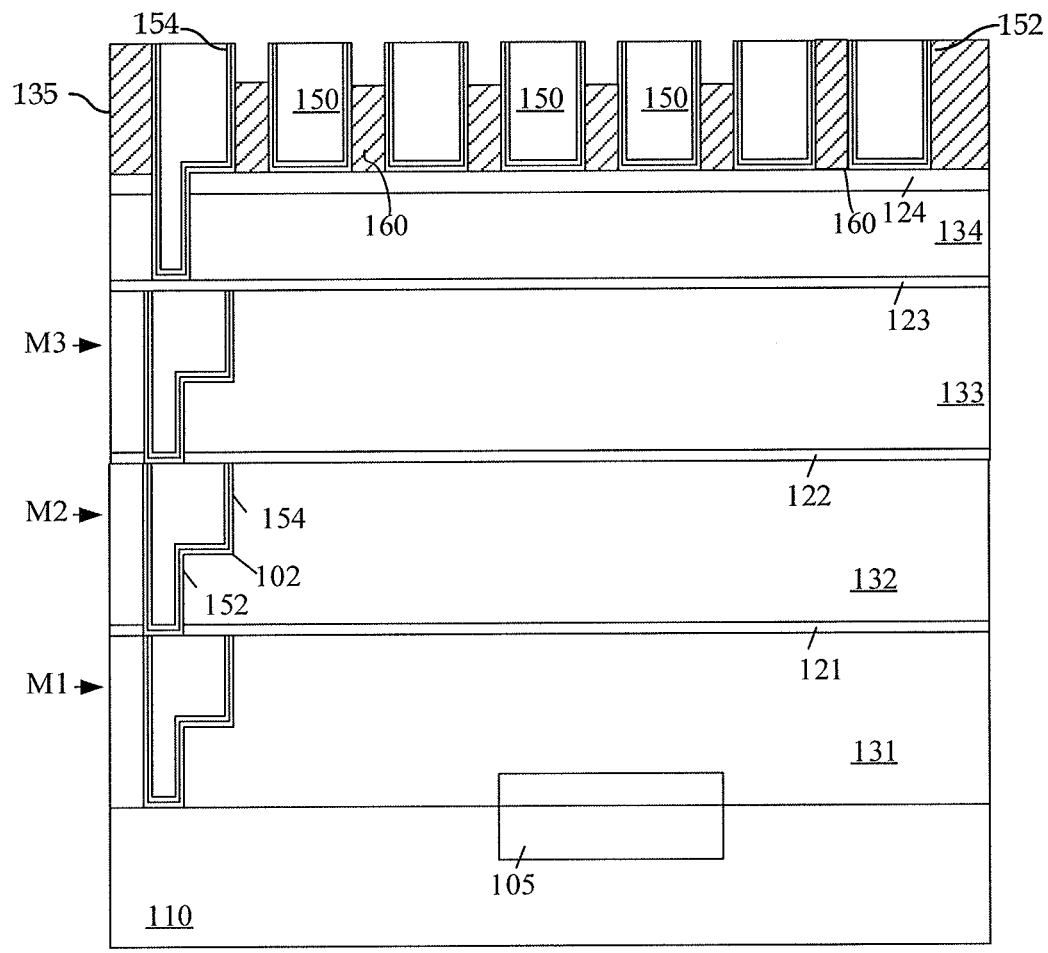
FIGS. 6A-6C, illustrates a semiconductor device in various stages of fabrication in accordance with an alternative embodiment of the present invention.
Figure 6B:
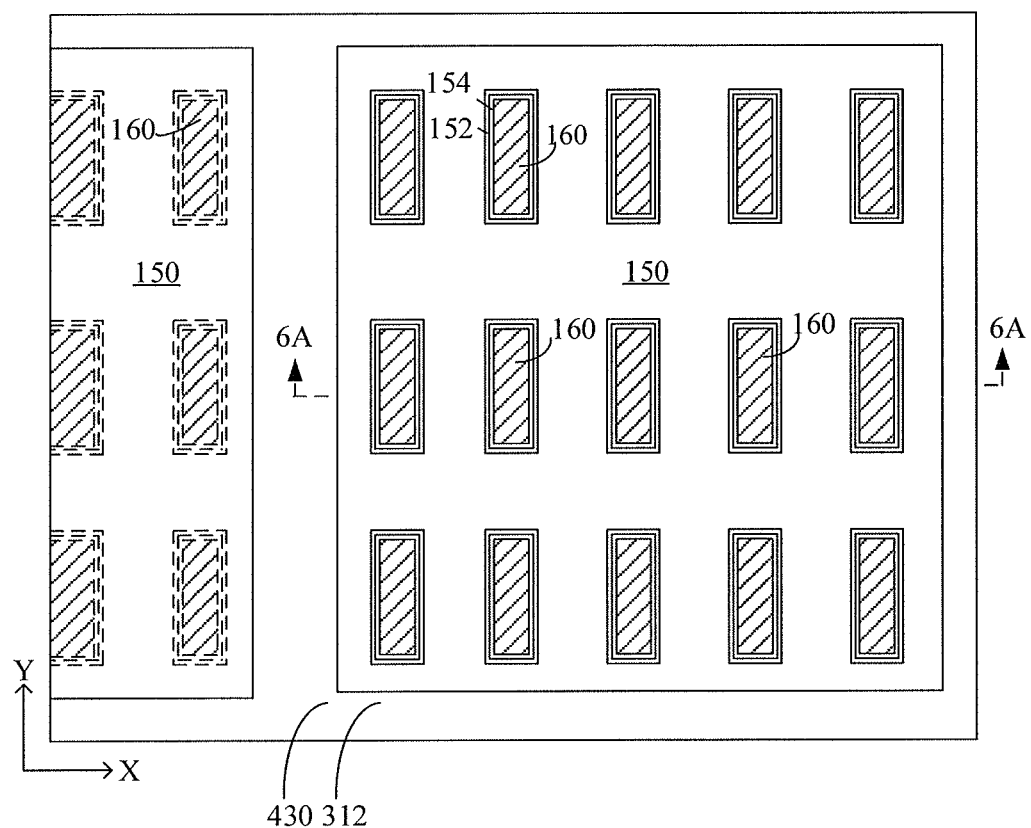
Figure 6C:
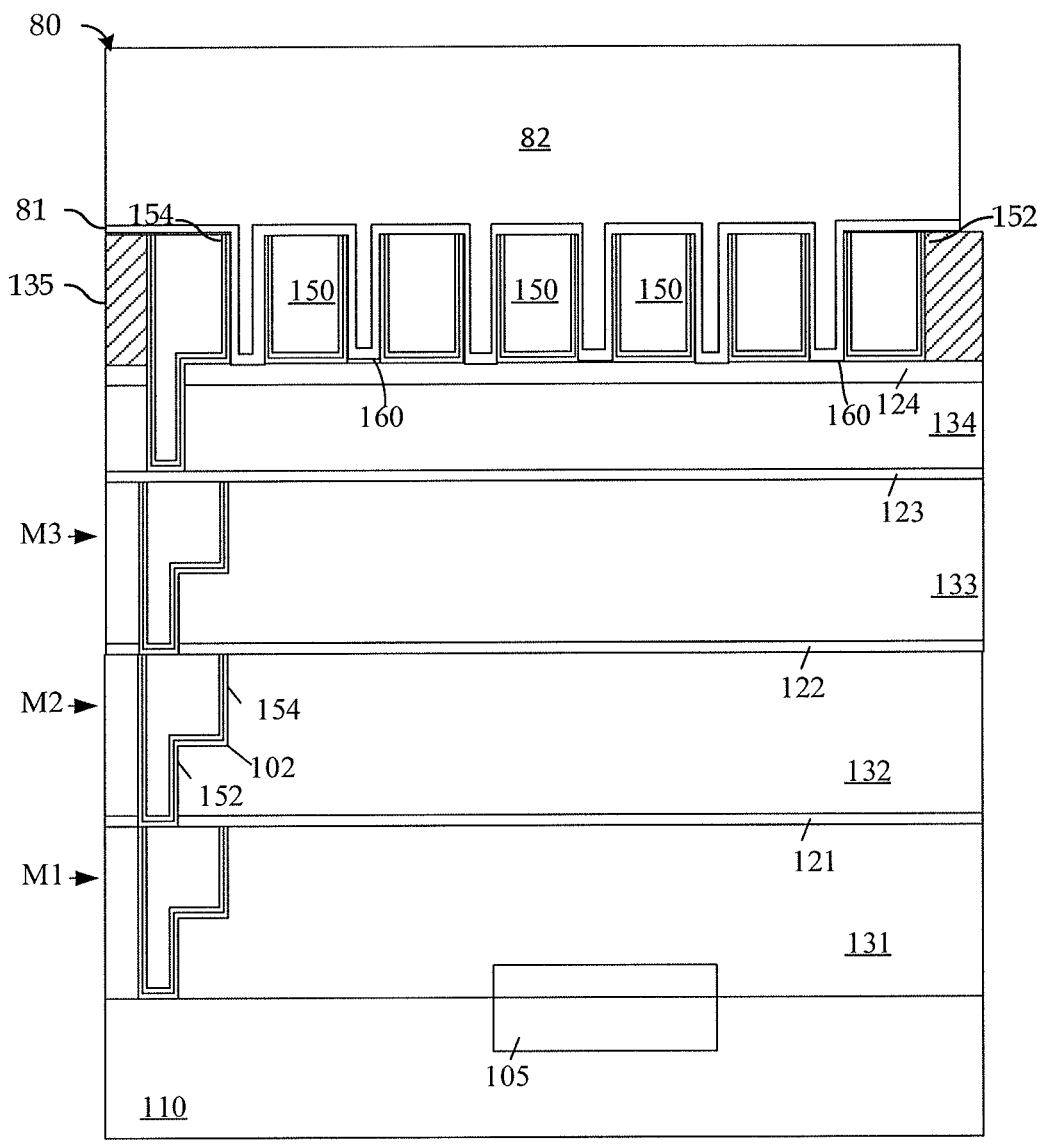

FIG. 6, which includes FIGS. 6A-6C, illustrates a semiconductor device in various stages of fabrication in accordance with an alternative embodiment of the present invention.

FIG. 6A and 6B illustrate a semiconductor device after forming a plurality of pad openings with a chip pad opening in accordance with an embodiment of the present invention. FIG. 6A illustrates a cross-sectional view while FIG. 6B illustrates a top view.

In this embodiment, the chip contact pad 150 is segmented partially. For example, only a part of the fifth inter level dielectric layer 135 is etched after opening the chip contact pad 150. For example, the etching of the exposed fifth inter level dielectric layer 135 may be timed so as to stop before reaching the underlying fourth etch stop liner 124. Thus, the plurality of pad openings 170 in the chip contact pads 150 is shallower than prior embodiments of the invention.

However, as the dielectric layer 135 is much thinner than the spacing between the sub-pads 150, the dielectric layer 135 between the pads is removed by either a pad-open etch on wafer level or by the laser drill process. Thus, the final structure in this embodiment resembles the final structure illustrated in FIG. 4.

Referring next to FIG. 6C, the conductive fill material 82 is deposited as described in prior embodiments. Subsequent processing continues as described previously in prior embodiments.

FIG. 7, which includes 7A-7E, illustrates a semiconductor device during fabrication in accordance with an alternative embodiment of the present invention.

In this embodiment, the liner 15 is deposited during the wafer fabrication process. After completion of the metallization levels including the chip contact pads 150, a liner 15 is deposited over the wafer 100. This is advantageously performed as a wafer level process prior to singulation of the wafer 100 into individual chips 50. Thus, a single process may deposit the liner 15 as a blanket layer over the wafer 100.

In further embodiments, an optional thick passivation layer may be formed and opened over the pad area at a wafer level. An imide layer may be formed over the passivation layer and may cover the pad area during the assembly process. The imide layer over the pad area may be removed during the formation of the opening for the chip interconnect. Such alternative embodiments are described in further embodiments of FIGS. 10-16.

Figure 7A:
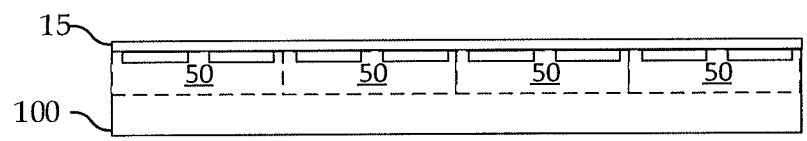
FIG. 7, which includes 7A-7E, illustrates a semiconductor device during fabrication in accordance with an alternative embodiment of the present invention.
Figure 7B:
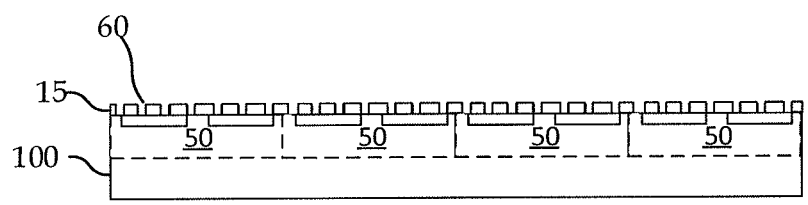

Referring next to FIG. 7B, the liner 15 is patterned to form a plurality of openings 60. The liner 15 may be patterned using conventional lithography processes in one embodiment.

Figure 7C:
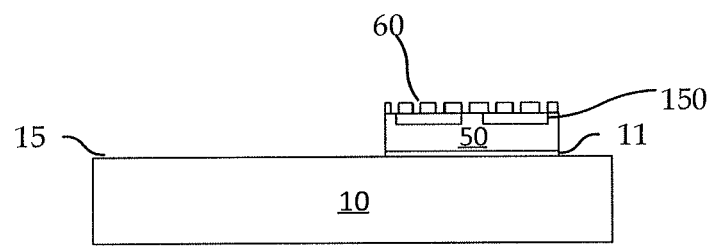
Figure 7D:
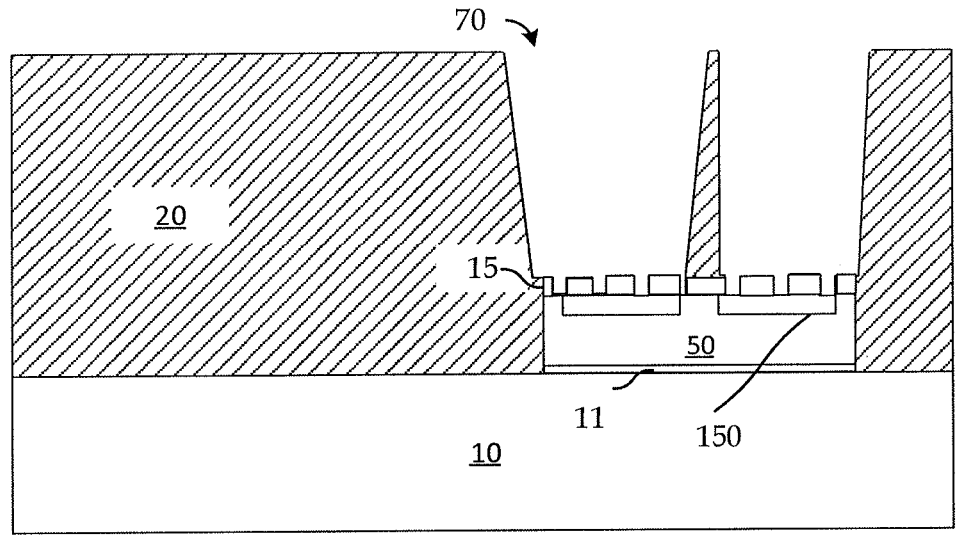

Referring to FIG. 7C, the wafer 100 is singulated to form individual semiconductor chips 50, which are placed over the substrate 100 as previously described with respect to FIG. 3.

Subsequent processing may follow the processing described with respect to FIG. 2. Thus, as next illustrated in FIG. 7D, an encapsulant 20 is applied over the (or plurality of) semiconductor chip(s) 50 and partially encloses the semiconductor chip 50. A plurality of contact openings 70 are formed within the encapsulant 20.

Figure 7E:
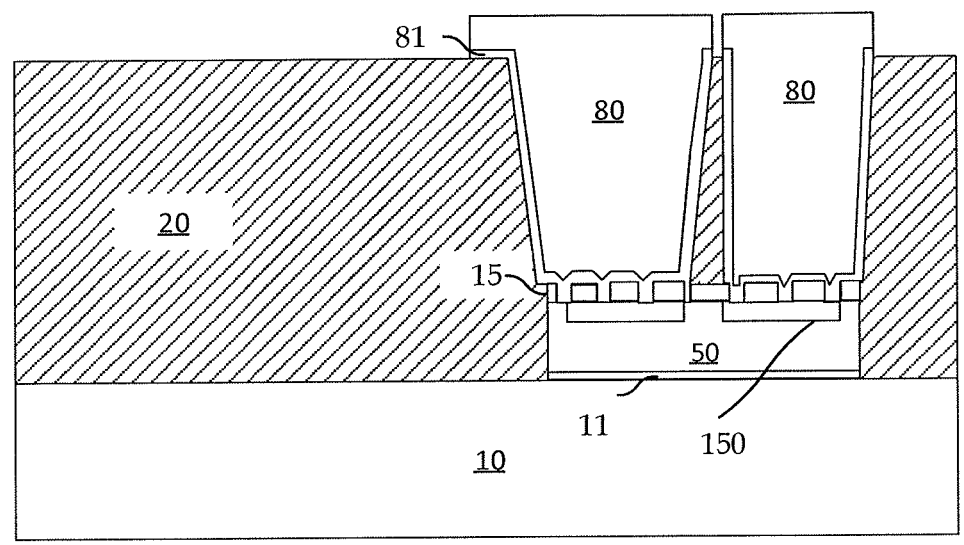

Referring next to FIG. 7E, the plurality of contact openings 70 and the plurality of through via openings are filled with a conductive material. A metal liner 81 may be formed within the plurality of contact openings 70 and the plurality of through via openings. A conductive fill material 82 is filled within the plurality of contact openings 70 and the plurality of through via openings. The conductive fill material 82 is structured to form contact interconnects 80 and through substrate openings.

FIG. 8, which includes 8A-8D, illustrates a semiconductor device during fabrication in accordance with an alternative embodiment of the present invention.

Similar to the embodiment described in FIG. 7 and in contrast to the embodiments described with respect to FIGS. 2 and 3 in this embodiment the liner 15 is formed during wafer level processing.

Figure 8A:
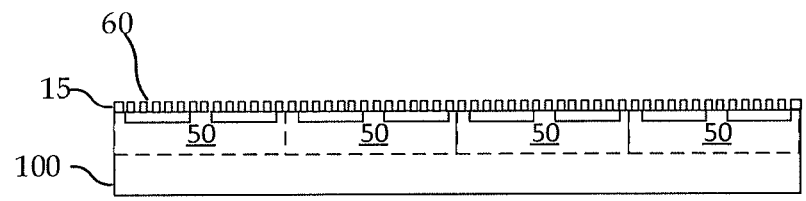
FIG. 8, which includes 8A-8D, illustrates a semiconductor device during fabrication in accordance with an alternative embodiment of the present invention.

Referring to FIG. 8A, in contrast to the prior embodiment, in this embodiment the liner 15 is patterned into smaller segments. In other words, in this embodiment and similar to the embodiment described using FIG. 3, the plurality of openings 60 are spaced apart closer than the embodiments described in FIGS. 2 and 7.

Figure 8B:
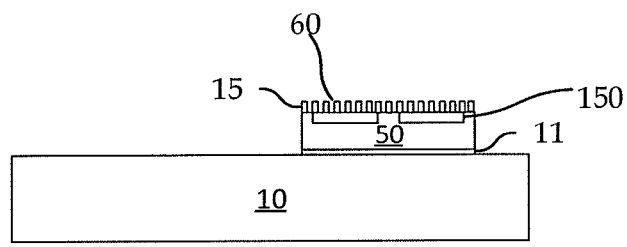

FIG. 8B illustrates the semiconductor device after singulating the wafer 100 and attaching the singulated semiconductor chip 50 to a substrate 10.

Figure 8C:
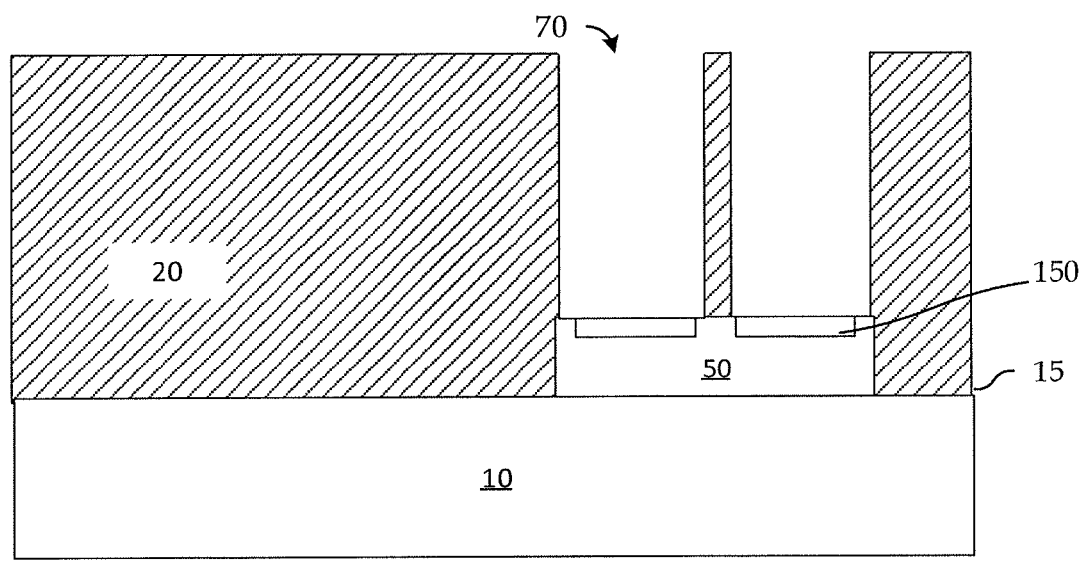

FIG. 8C illustrates the semiconductor device after forming the encapsulant 20 and the plurality of contact openings 70. As illustrated in FIG. 8C, a plurality of contact openings 70 are formed in the encapsulant 20. Unlike the prior embodiment described in FIGS. 2 and 7, the liner 15 forming the plurality of openings 60 is removed while forming the plurality of contact openings 70.

Figure 8D:
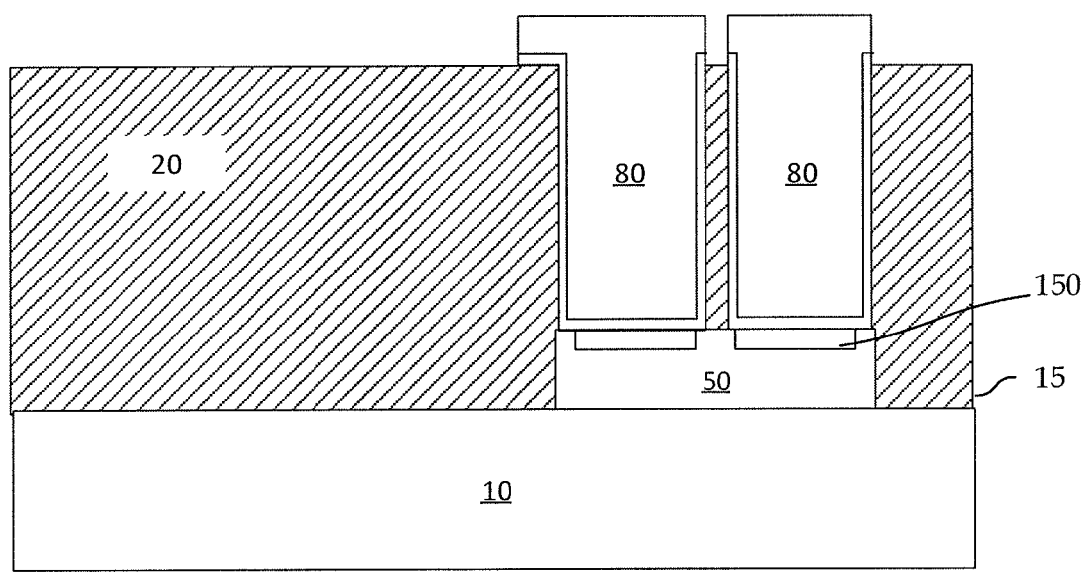

As next illustrated in FIG. 8D, the contact interconnects 80 may directly contact the chip contact pads 150. In other words, unlike the prior embodiments of FIGS. 2 and 7, the contact interconnects 80 may contact the semiconductor chip 50 directly.

FIG. 9, which includes FIGS. 9A-9D, illustrates a semiconductor device in accordance with an embodiment of the present invention.

Embodiments of the present invention may be applied to multiple chips in various embodiments. Accordingly, the semiconductor module 1 may comprise more than one semiconductor chips 50. Only as an illustration, only two semiconductor chips 50 are shown in FIG. 9.

Figure 9A:
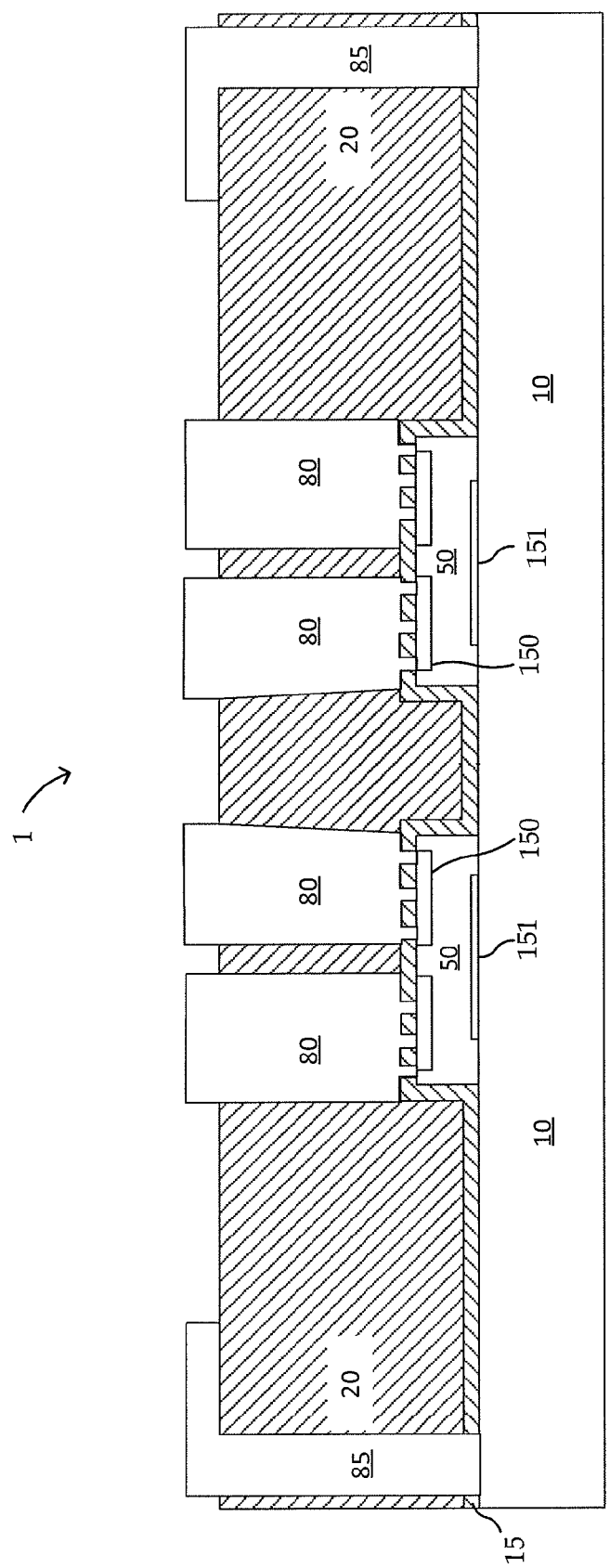
FIGS. 9A-9D, illustrates a semiconductor device in accordance with an embodiment of the present invention.

Referring to FIG. 9A, semiconductor chips 50 are disposed over a substrate 10, which may be a lead frame or other frames. The semiconductor chips 50 may have a plurality of chip contact pads 150 on one side and back side contacts 151 on the other side. The back side contacts 151 may be coupled to the substrate 10 using a conductive bond, which may be a solder bond in one embodiment. The substrate 10 may be coupled to a first side of the semiconductor device using through encapsulant vias 85. Further, the plurality of chip contact pads 150 may be coupled to external pads through contact interconnects 80.

Figure 9B:
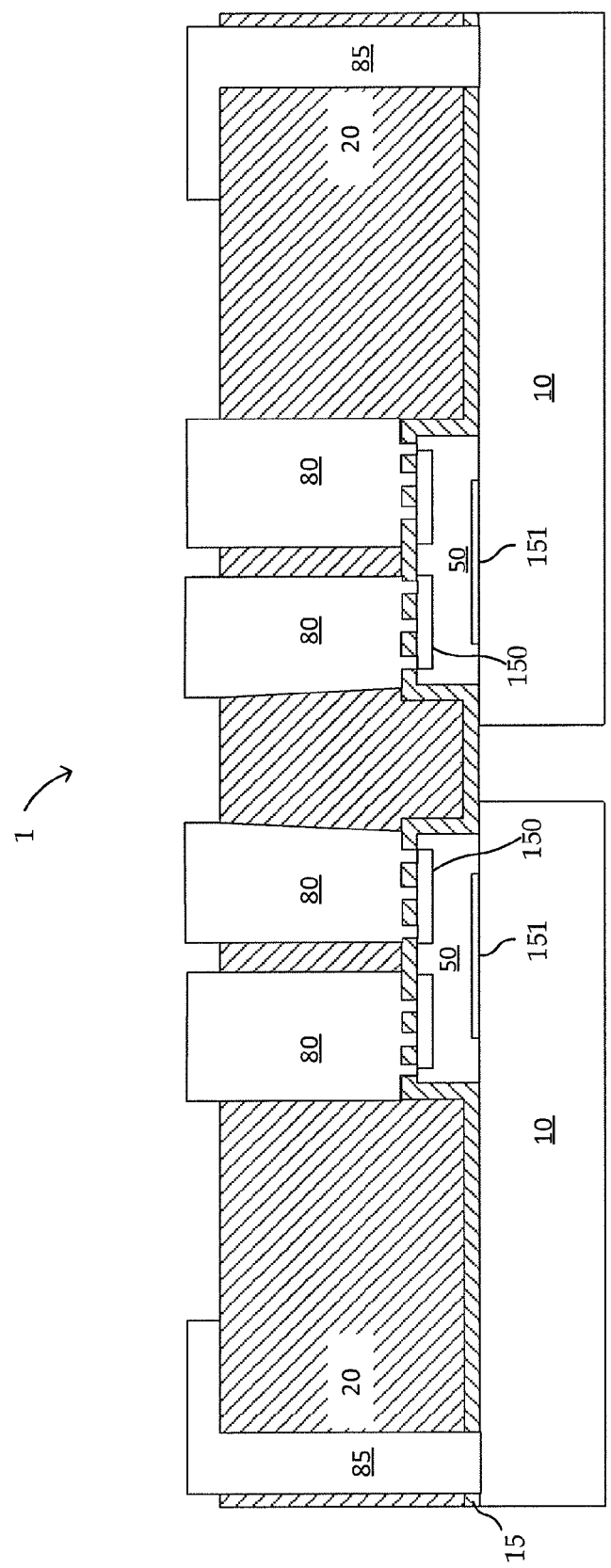

FIG. 9B illustrates a further alternative embodiment in which the semiconductor chips 50 are placed over electrically separated substrates 10, for example, over a first die paddle and a second die paddle of a lead frame.

Figure 9C:
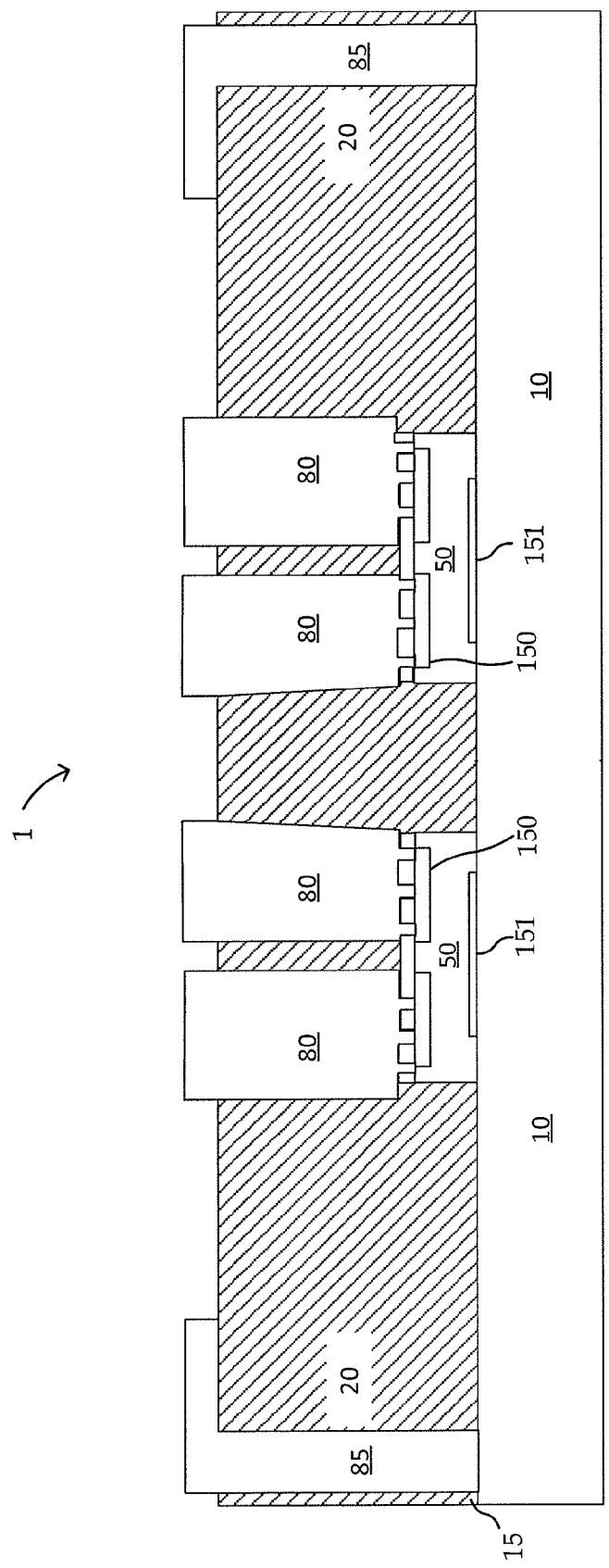

FIG. 9C illustrates an alternative embodiment of FIG. 9A in which the liner 15 is formed during wafer level processing. Therefore, the liner 15 is not disposed over the substrate 10.

Figure 9D:
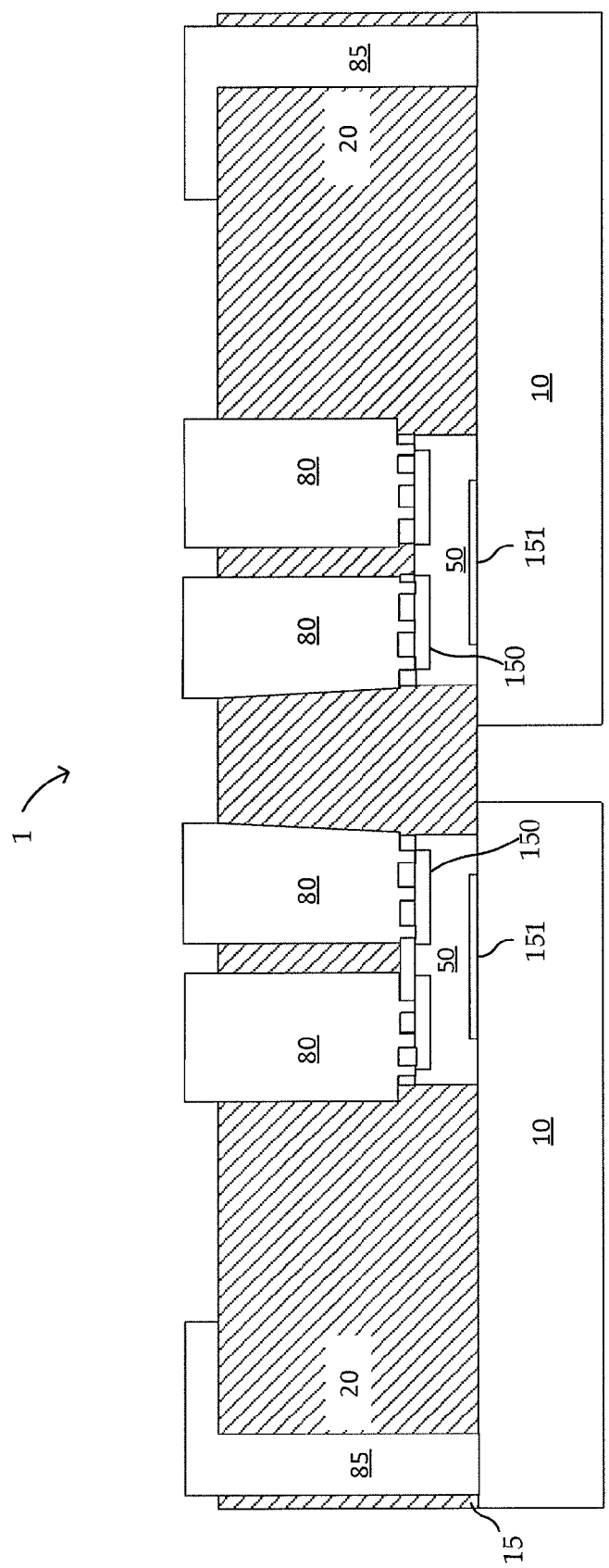

Similarly, FIG. 9D illustrates an alternative embodiment of FIG. 9B in which the liner 15 is formed during wafer level processing. Therefore, the liner 15 is not disposed over the substrate 10.

FIGS. 10-16 illustrate further embodiments of the present invention and illustrate only the semiconductor device after completion of wafer level processes and after the completion of the assembly process. For brevity, the intermediate stages are not described, which may follow the prior embodiments.

Figure 10A:
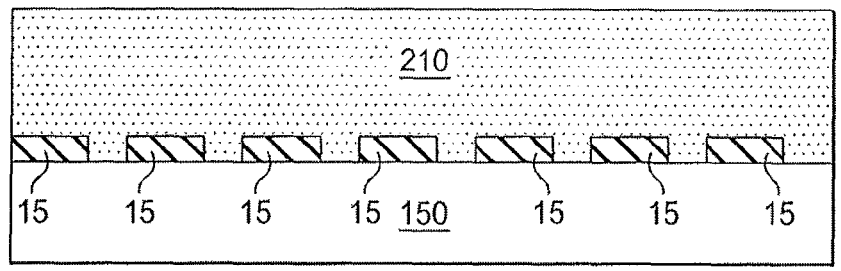
Figure 10B:
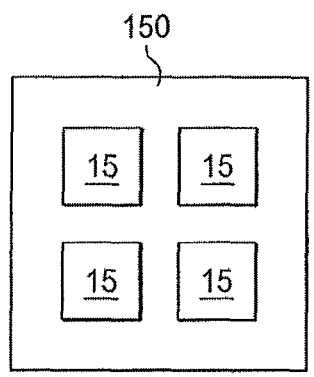
Figure 10C:
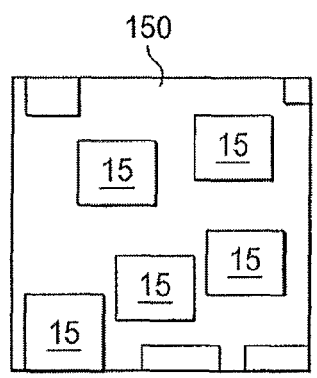
Figure 10D:
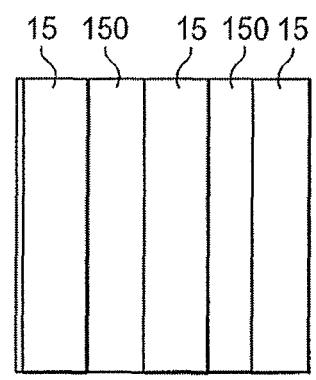
Figure 10E:
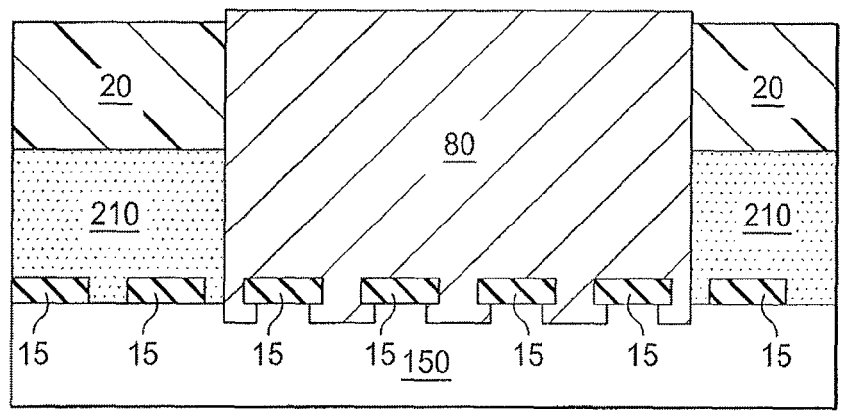

FIG. 10, which includes FIGS. 10A-10E, illustrates a semiconductor device in accordance with an embodiment of the present invention in which the patterned dielectric liner forms segmented pad contacts. FIG. 10A illustrates a cross-sectional view after wafer level processing, FIG. 10B-10D illustrate the corresponding plan view of the chip contact pad, and FIG. 10E illustrates the cross-sectional view of the semiconductor package after the formation of the contact interconnect.

In this embodiment, a polyimide layer 210 is formed over the patterned dielectric liner 15. The polyimide layer 210 may be skipped in some embodiments, for example, as illustrated in FIG. 7.

As illustrated in the plan view of FIGS. 10B-10D, the patterned dielectric liner 15 may be formed as rectangular regions, circular regions, or a plurality of lines.

FIG. 10E illustrates the semiconductor device after forming an encapsulant 20 and a chip interconnect 80 through the encapsulant 20. The polyimide layer 210 over the pad area may be removed during the formation of the opening for the chip interconnect 80. For example, a laser drilling process may progress through the encapsulant 20 and into the polyimide layer 210.

Figure 11A:
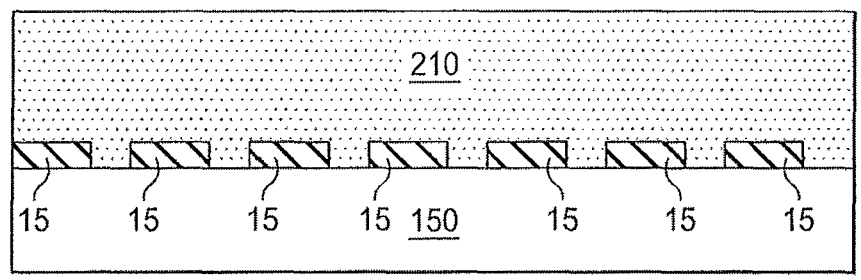
Figure 11B:
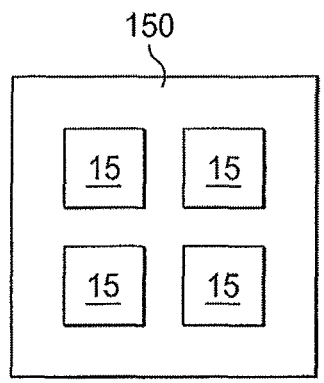
Figure 11C:
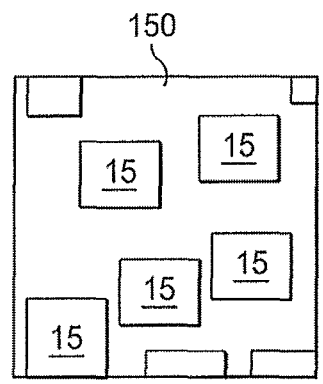
Figure 11D:
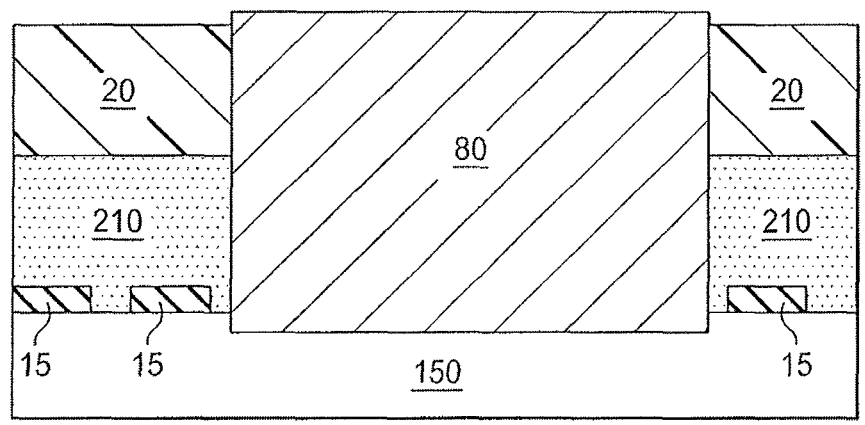

FIG. 11, which includes FIGS. 11A-11D, illustrates a semiconductor device in accordance with an embodiment of the present invention in which the patterned dielectric liner is lifted off during the formation of the opening for contact interconnect. FIG. 11A illustrates a cross-sectional view after wafer level processing, FIG. 11B-11C illustrate the corresponding plan view of the chip contact pad, and FIG. 11D illustrates the cross-sectional view of the semiconductor package after the formation of the contact interconnect.

Similar to FIG. 3 or FIG. 8, in this embodiment, the segmented or patterned dielectric liner 15 is lifted off during subsequent processing. For example, the patterned dielectric liner 15 is removed during the formation of the opening for the chip interconnect 80.

The embodiment illustrated in FIG. 11 includes the additional polyimide layer 210, which may be optional, for example, as not illustrated in FIG. 3 or 8.

Figure 12A:
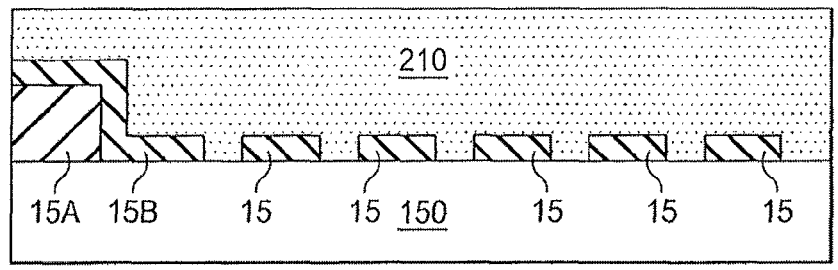
Figure 12B:
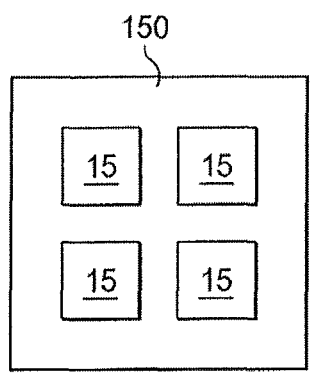
Figure 12C:
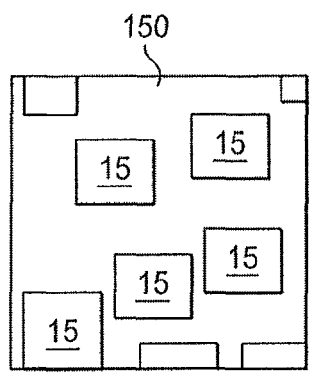
Figure 12D:
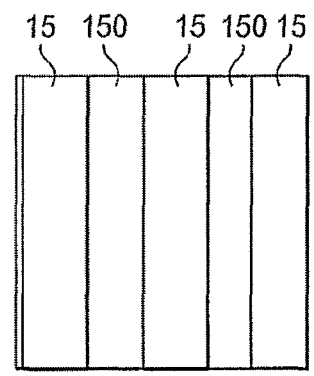
Figure 12E:
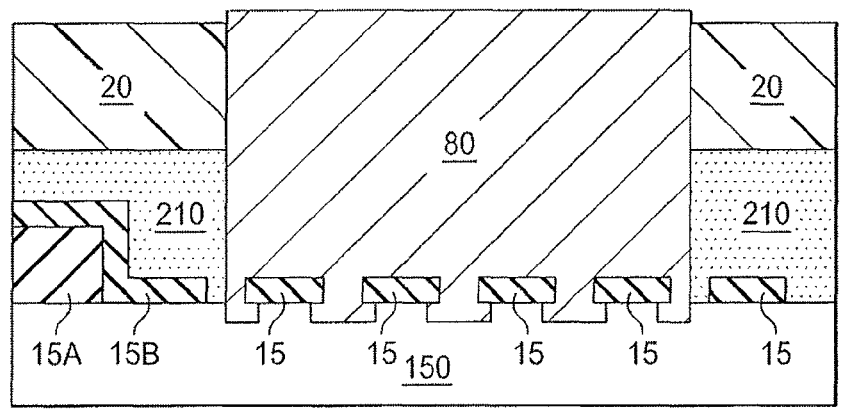

FIG. 12, which includes FIGS. 12A-12E, illustrates a semiconductor device in accordance with an embodiment of the present invention in which a dielectric liner comprising two layers is used to form a patterned dielectric liner. FIG. 12A illustrates a cross-sectional view after wafer level processing, FIG. 12B-12D illustrate the corresponding plan view of the chip contact pad, and FIG. 12E illustrates the cross-sectional view of the semiconductor package after the formation of the contact interconnect.

In this embodiment, the patterned dielectric liner 15 may comprise a first layer 15A and a second layer 15B. The first layer 15A may be removed from over the chip contact pad area and a second layer 15B may be deposited. The second layer 15B is then patterned. Thus, the other regions of the chip remain protected by a thick passivation layer.

As described in prior embodiments, although illustrated in FIG. 12, the polyimide layer 210 may be optional and may be skipped in other alternative embodiments. Alternatively, the polyimide layer 210 may be removed from over the pad area.

Figure 13A:
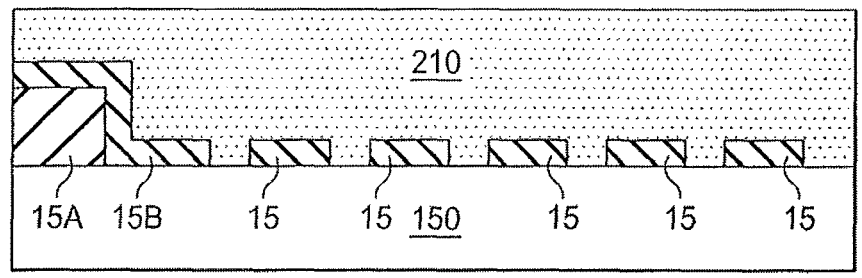
Figure 13B:
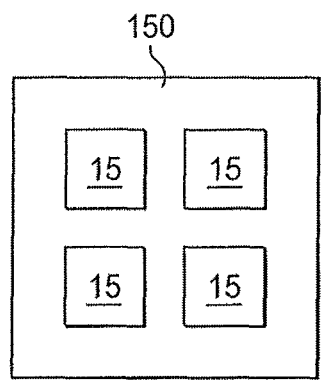
Figure 13C:
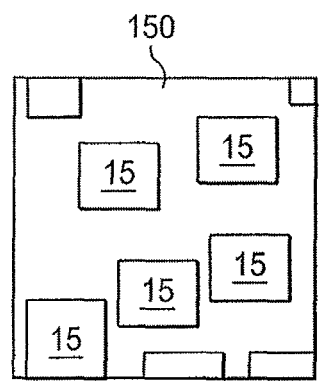
Figure 13D:
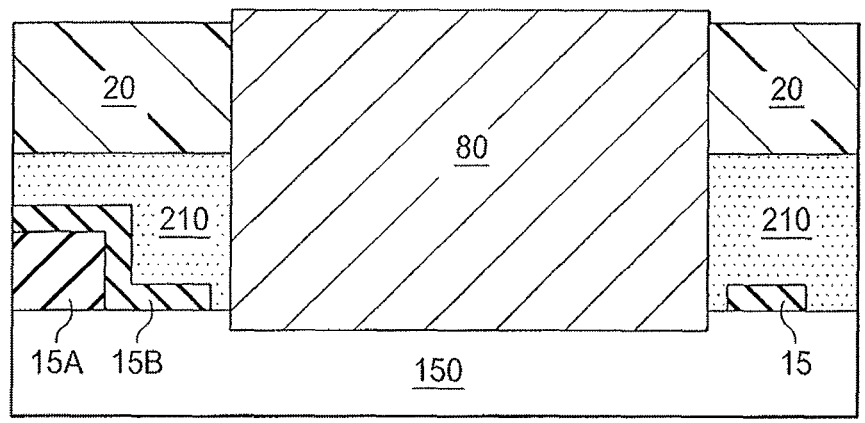

FIG. 13, which includes FIGS. 13A-13D, illustrates a semiconductor device in accordance with an alternative embodiment of the present invention in which a dielectric liner comprising two layers is used to form a patterned dielectric liner. FIG. 13A illustrates a cross-sectional view after wafer level processing, FIG. 13B-13C illustrate the corresponding plan view of the chip contact pad, and FIG. 13D illustrates the cross-sectional view of the semiconductor package after the formation of the contact interconnect.

Although this embodiment is similar to the prior embodiment and includes a first layer 15A and a second layer 15B, in this embodiment, the second layer 15B is lifted off completely during the etch for forming the opening for the chip interconnect. As in prior embodiments, the polyimide layer 210 may be skipped or may be removed only over the pad area.

Figure 14A:
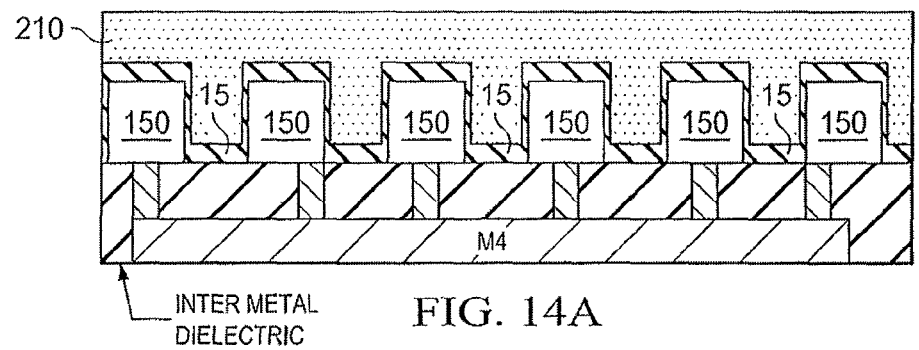
Figure 14B:
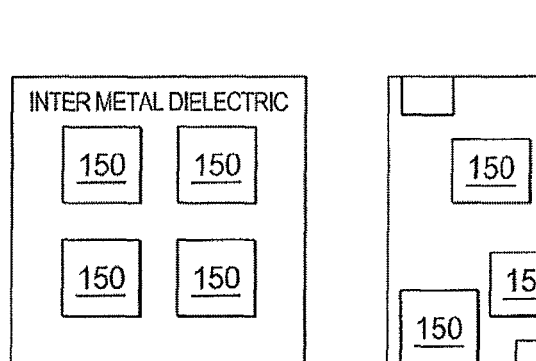
Figure 14C:
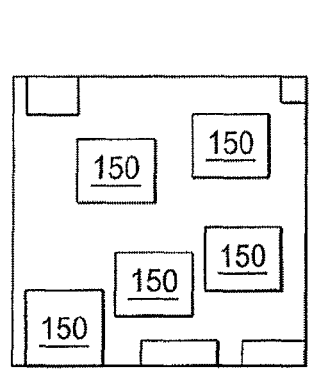
Figure 14D:
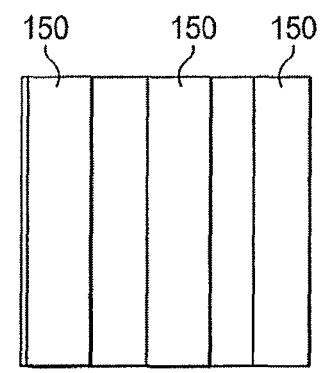
Figure 14E:
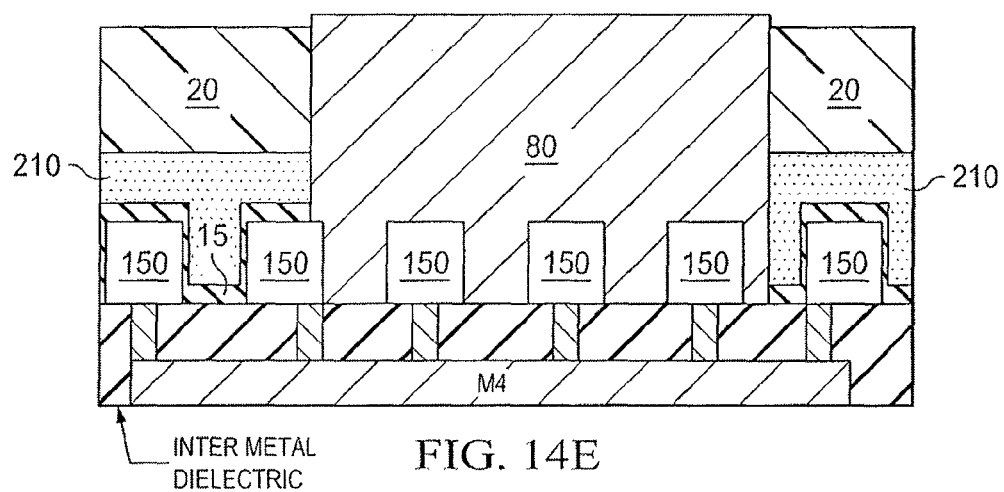

FIG. 14, which includes FIGS. 14A-14E, illustrates a semiconductor device in accordance with an embodiment of the present invention in which each substructure comprising a patterned chip contact area is coupled to an underlying via. FIG. 14A illustrates a cross-sectional view after wafer level processing, FIG. 14B-14D illustrate the corresponding plan view of the chip contact pad, and FIG. 14E illustrates the cross-sectional view of the semiconductor package after the formation of the contact interconnect.

This embodiment is similar to the embodiment described with respect to FIG. 4. However, unlike FIG. 4, in this embodiment, each of the patterned chip contact pad 150 is coupled to an underlying metal line of the upper most metal level through a via level. The vias are separated by an inter metal dielectric layer (IMD). Thus, unlike the embodiment of FIG. 4, the possibility of higher contact resistance (e.g., due to misalignments) of the chip interconnect 80 is mitigated.

As illustrated in FIG. 14A, a dielectric liner 15 is formed over the patterned chip contact pad 150. An optional polyimide layer 210 may be formed over the dielectric liner 15. Alternatively, the polyimide layer 210 may be removed from over the pad area only. As next illustrated in FIG. 14E, the semiconductor device is packaged by encapsulating in a encapsulant 20 and forming a chip interconnect 80.

Figure 15A:
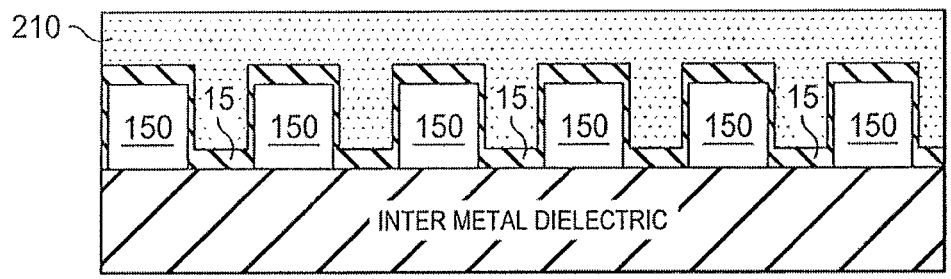
Figure 15B:
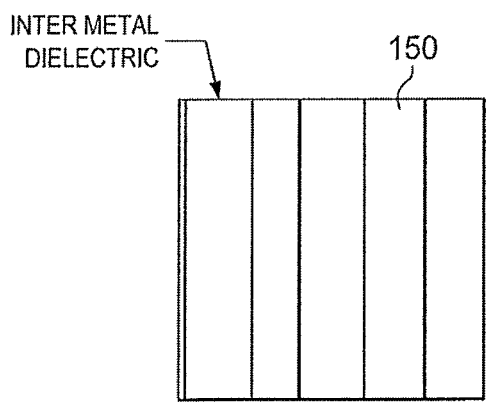
Figure 15C:
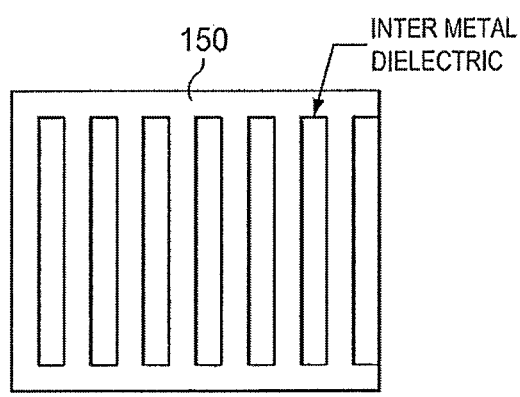
Figure 15D:
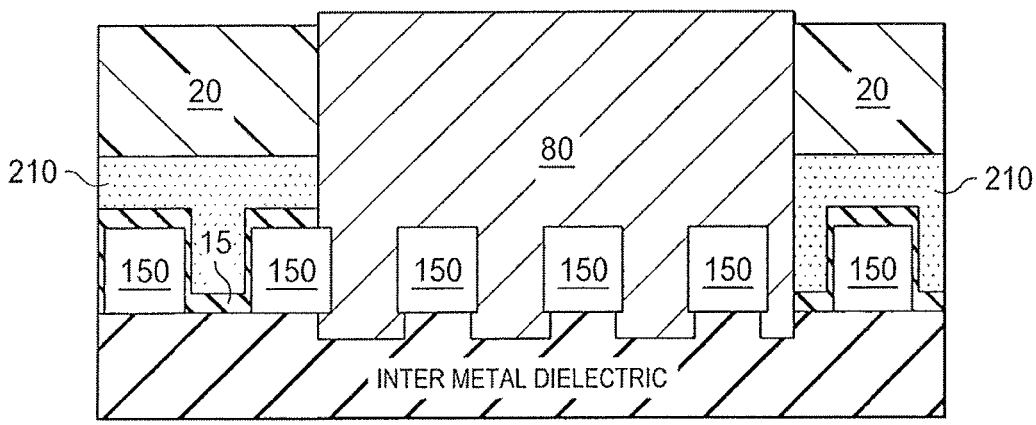

FIG. 15, which includes FIGS. 15A-15D, illustrates a semiconductor device in accordance with an embodiment of the present invention in which the patterned chip contact pad is coupled through an outer rim. FIG. 15A illustrates a cross-sectional view after wafer level processing, FIG. 15B-15C illustrate the corresponding plan view of the chip contact pad, and FIG. 15D illustrates the cross-sectional view of the semiconductor package after the formation of the contact interconnect.

Unlike the prior embodiment of FIG. 14, in this embodiment, each of the substructures of the chip contact pad 150 are coupled to each other by an outer section. For example, the chip contact pads 150 are patterned as a plurality of lines, which may have coupled to each other through another section (e.g., 15C). As in prior embodiments, the polyimide layer 210 may be skipped or may be removed only over the pad area.

FIG. 15D illustrates the semiconductor package after forming the chip interconnect 80 through the encapsulant 20.

Figure 16A:
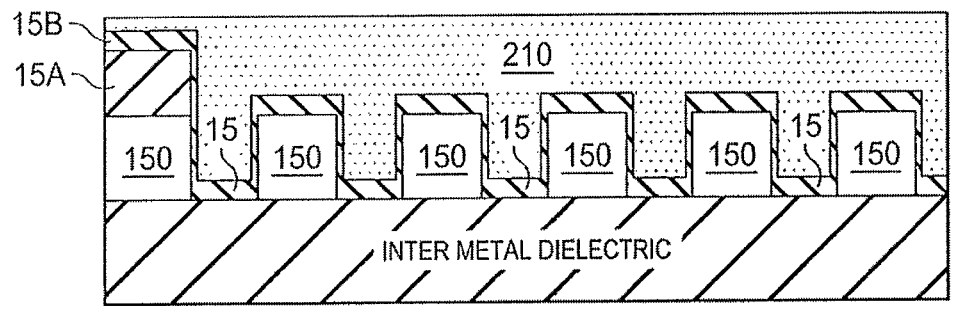
Figure 16B:
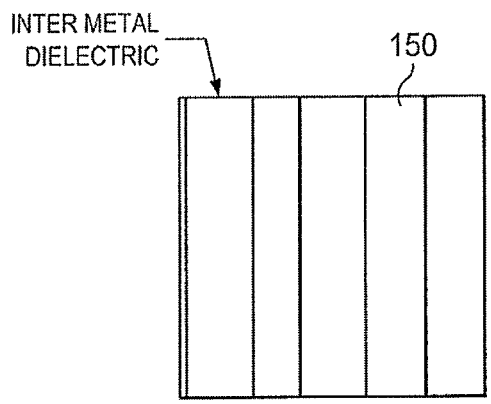
Figure 16C:
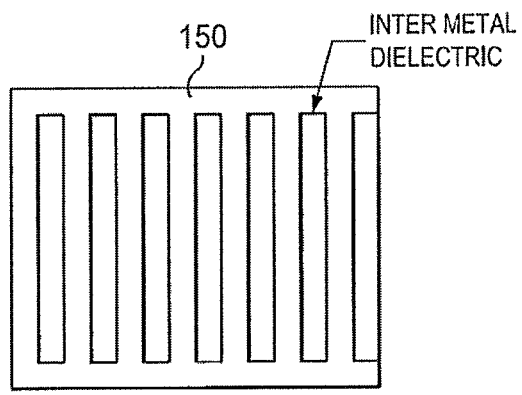
Figure 16D:
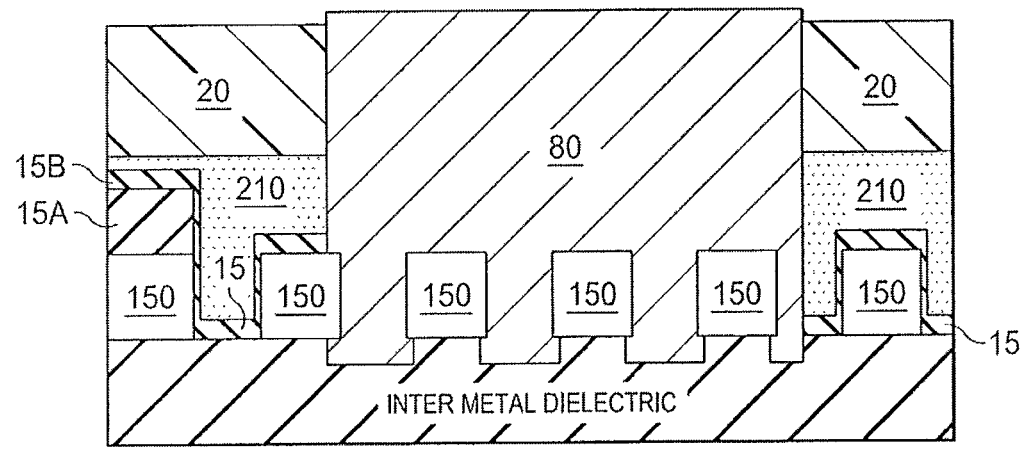

FIG. 16, which includes FIGS. 16A-16D, illustrates a semiconductor device in accordance with an alternative embodiment of the present invention in which the patterned chip contact pad is coupled through an outer rim. FIG. 16A illustrates a cross-sectional view after wafer level processing, FIG. 16B-16C illustrate the corresponding plan view of the chip contact pad, and FIG. 16D illustrates the cross-sectional view of the semiconductor package after the formation of the contact interconnect.

This embodiment is similar to FIG. 15 and includes an outer rim portion coupling the substructures of the patterned chip contact pad 150. However, this embodiment also includes a two layered liner as described previously in FIGS. 12 and 13. As in prior embodiments, the polyimide layer 210 may be skipped or may be removed only over the pad area.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1-16 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
providing a first semiconductor chip having a first side and an opposite second side;
attaching the second side of the first semiconductor chip to a conductive plate, the first semiconductor chip having a first chip contact pad on the first side;
after attaching the second side of the first semiconductor chip to the conductive plate, forming a dielectric liner over the first semiconductor chip and the conductive plate, the dielectric liner contacting the first semiconductor chip and the conductive plate;
patterning a portion of the dielectric liner to form a plurality of segments, wherein at least some of the plurality of segments is shorter than the first chip contact pad so that a number of the plurality of segments is formed directly over the first chip contact pad;
forming an encapsulant over the first semiconductor chip and the plurality of segments, the encapsulant contacting a portion of a dielectric liner contacting the conductive plate;

forming an interconnect opening in the encapsulant to expose the plurality of segments; and forming an interconnect to the first chip contact pad by depositing a conductive material in the interconnect opening.

2. The method of claim 1, wherein forming the interconnect opening comprises using a pulsed laser process.

3. The method of claim 1, wherein attaching the second side of the first semiconductor chip to the conductive plate comprises using a soldering process or an adhesive glue.

4. The method of claim 1, wherein the conductive plate is a die paddle of a leadframe.

5. The method of claim 1, wherein forming the dielectric liner over the first semiconductor chip and patterning the portion of the dielectric liner over the first chip contact pad comprise:

forming a first layer over the first semiconductor chip;

patterning the first layer to expose the first chip contact pad;

depositing a second layer over the first layer and the exposed first chip contact pad; and patterning the second layer to expose portions of the first chip contact pad.

6. The method of claim 5, further comprising forming an imide layer over the second layer before forming the encapsulant.

7. The method of claim 1, further comprising forming an imide layer before forming the encapsulant.

8. The method of claim 1, wherein the interconnect contacts the first chip contact pad through gaps between adjacent segments of the plurality of segments.

9. The method of claim 1, further comprising forming spacers on sidewalls of the plurality of metallic segments.

10. The method of claim 9, wherein the spacers comprise the same material as the encapsulant.

11. The method of claim 1, further comprising testing the first semiconductor chip after forming the plurality of segments before forming the encapsulant.

12. A method comprising:

providing a first semiconductor chip having a first side and an opposite second side, the first semiconductor chip having a first chip contact pad on the first side;

forming a first chip contact pad in a dielectric layer of an uppermost metal level of the first semiconductor chip, the first chip contact pad comprising a plurality of metallic segments that are electrically interconnected and disposed in the dielectric layer, and wherein the plurality of metallic segments is separated by openings in the first chip contact pad;

attaching the second side of the first semiconductor chip to a conductive plate;

forming an encapsulant over the first semiconductor chip; and forming an interconnect through the encapsulant and the openings of the first chip contact pad.

13. The method of claim 12, wherein forming the interconnect comprises:

forming a interconnect opening in the encapsulant; and filling the interconnect opening with a conductive material.

14. The method of claim 13, wherein forming the interconnect opening comprises using a pulsed laser process.

15. The method of claim 12, wherein attaching the second side of the first semiconductor chip to the conductive plate comprises using a soldering process or an adhesive glue.

16. The method of claim 12, wherein the conductive plate is a die paddle of a leadframe.

17. The method of claim 12, further comprising forming an imide layer before forming the encapsulant.

18. The method of claim 12, wherein the plurality of metallic segments is coupled to an underlying metal line through a via.

19. The method of claim 12, further comprising forming spacers on sidewalls of the plurality of metallic segments.

20. The method of claim 19, wherein the spacers comprise the same material as the encapsulant.

21. The method of claim 12, wherein forming the first chip contact pad comprises patterning a portion of the first chip contact pad to form the openings.

22. A method comprising:

providing a first semiconductor chip having a first side and an opposite second side, the first semiconductor chip having a first chip contact pad on the first side;

providing a first chip contact pad within a dielectric layer of an uppermost metal level of the first semiconductor chip, the first chip contact pad comprising a plurality of metallic segments that are electrically interconnected and disposed within the dielectric layer, and wherein the plurality of metallic segments is separated by openings in the first chip contact pad, wherein the plurality of metallic segments comprise a metallic top surface and sidewalls covered with an insulating sidewall spacer;

attaching the second side of the first semiconductor chip to a conductive plate;

forming an encapsulant over the first semiconductor chip;

forming an opening in the encapsulant to expose the metallic top surface and the insulating sidewall spacer; and depositing a conductive material through the encapsulant and the openings of the first chip contact pad, wherein the conductive material covers the metallic top surface and the insulating sidewall spacer.

23. The method of claim 22, wherein forming the interconnect opening comprises using a pulsed laser process.

24. The method of claim 22, wherein the interconnect contacts the first chip contact pad through gaps between adjacent segments of the plurality of segments.

* * * * *